United States Patent
Kumazawa et al.

(10) Patent No.: US 11,466,123 B2
(45) Date of Patent: Oct. 11, 2022

(54) RESIN COMPOSITION, RESIN SHEET, MULTILAYER PRINTED WIRING BOARD, AND SEMICONDUCTOR DEVICE

(71) Applicant: MITSUBISHI GAS CHEMICAL COMPANY, INC., Tokyo (JP)

(72) Inventors: Yune Kumazawa, Tokyo (JP); Takuya Suzuki, Tokyo (JP); Seiji Shika, Tokyo (JP); Shunsuke Katagiri, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 17/621,926

(22) PCT Filed: Jun. 26, 2020

(86) PCT No.: PCT/JP2020/025139
§ 371 (c)(1),
(2) Date: Dec. 22, 2021

(87) PCT Pub. No.: WO2020/262577
PCT Pub. Date: Dec. 30, 2020

(65) Prior Publication Data
US 2022/0204695 A1 Jun. 30, 2022

(30) Foreign Application Priority Data

Jun. 28, 2019 (JP) .............................. JP2019-122156

(51) Int. Cl.
| | |
|---|---|
| *C08G 73/10* | (2006.01) |
| *H05K 1/02* | (2006.01) |
| *H05K 1/03* | (2006.01) |
| *C08K 5/3417* | (2006.01) |

(52) U.S. Cl.
CPC ........ *C08G 73/1025* (2013.01); *C08K 5/3417* (2013.01); *H05K 1/0298* (2013.01); *H05K 1/036* (2013.01)

(58) Field of Classification Search
CPC ......... H05K 3/4626; C08F 22/40; C08F 2/50; C08G 59/4014; C08L 79/085
USPC ...................................................... 528/310
See application file for complete search history.

(56) References Cited

U.S. PATENT DOCUMENTS

| | | | |
|---|---|---|---|
| 2003/0104232 A1 | 6/2003 | Kihara et al. | |
| 2010/0063184 A1* | 3/2010 | Dershem | C09J 135/06 525/185 |
| 2015/0191588 A1* | 7/2015 | Choi | G03F 7/027 522/64 |
| 2018/0355231 A1 | 12/2018 | Litke et al. | |
| 2019/0281697 A1 | 9/2019 | Abe et al. | |
| 2020/0166844 A1 | 5/2020 | Okada et al. | |

FOREIGN PATENT DOCUMENTS

| | | |
|---|---|---|
| CN | 103145988 A | 6/2013 |
| JP | 2003-141936 A | 5/2003 |
| JP | 2005-62450 A | 3/2005 |
| JP | 2010-204298 A | 9/2010 |
| JP | 2011-245675 A | 12/2011 |
| JP | 2014-1289 A | 1/2014 |
| JP | 2015-229734 A | 12/2015 |
| JP | 2016-169337 A | 9/2016 |
| JP | 2018-189851 A | 11/2018 |
| WO | WO 2013/172434 A1 | 11/2013 |
| WO | 2017/136669 A1 | 8/2017 |
| WO | WO 2018/056466 A1 | 3/2018 |
| WO | 2018/212116 A1 | 11/2018 |

OTHER PUBLICATIONS

ISR for PCT/JP2020/025139, dated Aug. 18, 2020.
Notice of Reasons for Refusal for JP App. No. 2020-555079, dated Nov. 6, 2020 (w/ translation).
Certified Experimental Results filed in JP Patent No. 6850447 B, issued from JP App. No. 2020-555079, dated Sep. 17, 2021 (filed Nov. 4, 2021) (w/translation).
Written Opinion of the International Searching Authority issued in International Patent Application No. PCT/JP2020/025139, dated Aug. 18, 2020 along with an English translation thereof.

* cited by examiner

*Primary Examiner* — Doris L Lee
(74) *Attorney, Agent, or Firm* — Greenblum & Bernstein, P.L.C.

(57) ABSTRACT

The resin composition of the present invention is a resin composition containing: a bismaleimide compound (A) containing a constituent unit represented by the following formula (1) and maleimide groups at both ends of the molecular chain; a compound (B) containing one or more carboxy groups; and a photo initiator (C).

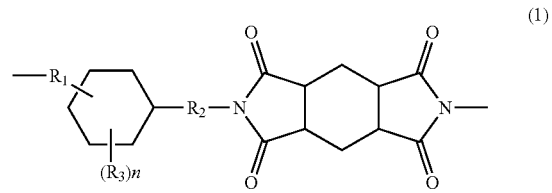

In the formula (1), $R_1$ represents a linear or branched alkylene group having 1 to 16 carbon atoms, or a linear or branched alkenylene group having 2 to 16 carbon atoms. $R_2$ represents a linear or branched alkylene group having 1 to 16 carbon atoms, or a linear or branched alkenylene group having 2 to 16 carbon atoms. Each $R_3$ independently represents a hydrogen atom, a linear or branched alkyl group having 1 to 16 carbon atoms, or a linear or branched alkenyl group having 2 to 16 carbon atoms. Each n independently represents an integer of 1 to 10.

7 Claims, 1 Drawing Sheet

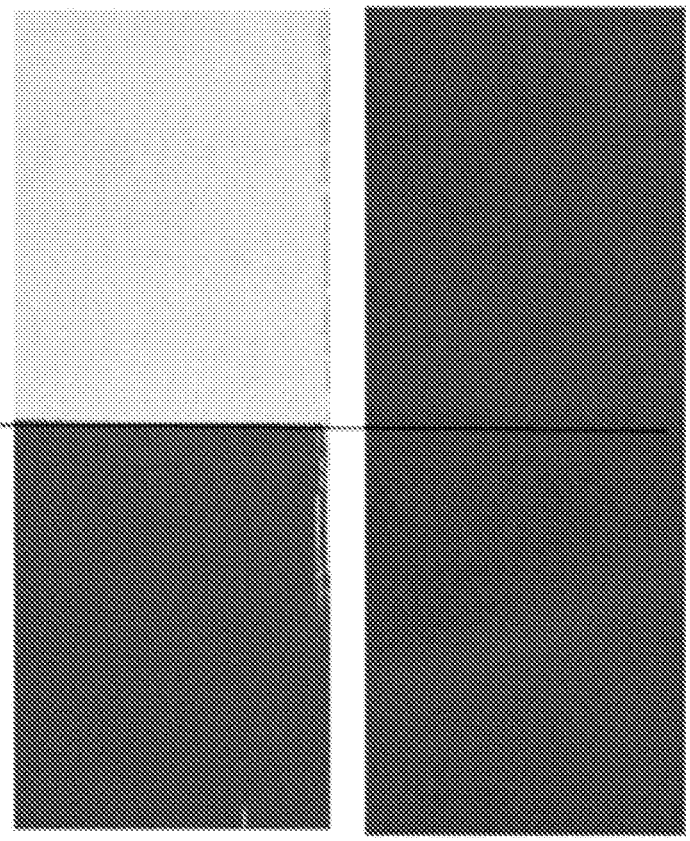

RESIN COMPOSITION, RESIN SHEET, MULTILAYER PRINTED WIRING BOARD, AND SEMICONDUCTOR DEVICE

TECHNICAL FIELD

The present invention relates to a resin composition, a resin sheet, a multilayer printed wiring board, and semiconductor device.

BACKGROUND ART

Due to the downsizing and densification of multilayer printed wiring boards, studies have been actively conducted to make the laminate used for multilayer printed wiring boards thinner. Along with the thinning, the insulation layer also needs to be made thinner, and a resin sheet not containing glass cloth has been demanded. The resin composition used as the material of the insulation layer is mainly a thermosetting resin, and drilling of holes between insulation layers to obtain conduction is generally carried out by laser processing.

Meanwhile, the drilling of holes by laser processing has a problem that the processing time becomes longer as the number of holes in a high density substrate becomes larger. In recent years, therefore, there has been a demand for a resin sheet that enables batch drilling in the exposure and development steps by using a resin composition in which an exposed portion is cured by irradiation of rays of light or the like (exposure step) and an unexposed portion can be removed (development step).

As the method of exposure, a method in which a mercury lamp is used as a light source and the exposure is carried out via a photomask is used. A material which can be suitably exposed in the method using a mercury lamp as a light source has been demanded. In the exposure method using a mercury lamp as a light source, a ghi line (a g-line with a wavelength of 436 nm, an h-line with a wavelength of 405 nm and an i-line with a wavelength of 365 nm) or the like is used, and a general-purpose photo initiator can be selected. Also, in recent years, the introduction of a direct imaging method, in which a pattern is directly drawn on the photosensitive resin composition layer without using a photomask, based on digital data of the pattern, has also been progressing as the exposure method. Since this direct imaging method provides better alignment accuracy than the exposure method using a photomask and produces a more detailed pattern, the introduction of this method has been progressing, especially for substrates that require the formation of high density wiring. The light source for this method is a monochromatic light source such as a laser, and in particular, a light source with a wavelength of 405 nm (h-line) is used in devices based on the DMD (Digital Micromirror Device) system, which is capable of forming highly detailed resist patterns.

As a development method, alkaline development is employed because a highly detailed pattern can be obtained.

For such a photosensitive resin compositions used in laminates and resin sheets, compounds having an ethylenically unsaturated group, such as (meth)acrylate, are used in order to enable rapid curing in the exposure step.

For example, Patent Document 1 describes a photosensitive thermosetting resin composition containing a carboxyl modified epoxy (meth)acrylate resin, a biphenyl-based epoxy resin, a photo initiator, and a diluent, the carboxyl modified epoxy (meth)acrylate resin being obtained by reacting a bisphenol-based epoxy resin with (meth)acrylic acid and then reacting the resultant with an acid anhydride.

In addition, Patent Document 2 describes a resin composition containing a photocurable binder polymer, a photopolymerization compound having an ethylenically unsaturated bond, a photopolymerization (curing) initiator, a sensitizer, and a bisallylnadic imide compound and a bismaleimide compound, which are thermosetting agents.

Patent Document 3 describes a resin composition containing a bismaleimide compound (a curable resin) and a photo radical polymerization initiator (a curing agent) as a photosensitive resin composition used for laminates and resin sheets.

Patent Document 4 describes a resin composition containing a curable resin such as an epoxy resin and a polyvalent carboxy group-containing compound obtained by reacting bismaleimide with a monoamine, and then reacting an acid anhydride. Patent Document 4 describes a polyvalent carboxy group-containing compound which enables production of a cured product having alkaline-developability.

CITATION LIST

Patent Document

Patent Document 1: Japanese Patent Laid-Open No. 2005-62450
Patent Document 2: Japanese Patent Laid-Open No. 2010-204298
Patent Document 3: International Publication No. WO 2018/56466 (A1)
Patent Document 4: Japanese Patent Laid-Open No. 2015-229734

SUMMARY OF INVENTION

Technical Problem

However, cured products using conventional (meth)acrylate-based resins do not provide a sufficient physical property, and are limited in forming excellent protective films and interlayer insulation layers. In addition, these cured products do not have sufficient alkaline-developability, do not produce highly detailed resist patterns, and are problematic for use as high density printed wiring boards.

The cured products obtained from the resin composition described in Patent Document 1 do not have sufficient alkaline-developability, do not produce highly detailed resist patterns, and are problematic for use as high density printed wiring boards.

In Patent Document 2, the use of a bismaleimide compound is described as a thermosetting agent, and (meth)acrylate is used as a photopolymerizable compound. Therefore, the cured products obtained from the resin composition described in Patent Document 1 do not have sufficient alkaline-developability, do not produce highly detailed resist patterns, and are problematic for use as high density printed wiring boards.

In Patent Document 3, a bismaleimide compound is used as a curable resin, but since the maleimide compound normally has poor light transmissivity, when the maleimide compound is contained, light does not reach the photo initiator sufficiently, the photo initiator has difficulty generating radicals, and its reactivity is very low. Therefore, in Patent Document 3, the maleimide compound is cured by additional heating before development, and highly detailed resist patterns cannot be obtained because heating is performed. Since originally, the resin composition does not have sufficient alkaline-developability, an unexposed resin composition remains even after development. This also suggests that in Patent Document 3, a highly detailed resist pattern cannot be obtained, and the resin composition cannot be used for production of high density printed wiring boards.

For obtaining the polyvalent carboxy group-containing compound described in Patent Document 4, it is necessary to react bismaleimide with a monoamine and then react an acid anhydride, so that the process is complicated. In addition, an aromatic amine compound is used as the monoamine, and therefore the polyvalent carboxy group-containing compound contains an amide group having an aromatic ring in the structure thereof. Thus, the polyvalent carboxy group-containing compound is poor in light transmittivity, hinders photocuring reaction, and is therefore difficult to use for photosensitive resin compositions in reality.

The present invention has been made in view of the problems described above, and an object of the present invention is to provide a resin composition which does not inhibit a photocuring reaction and has excellent photocurability in an exposure step and is capable of imparting excellent alkaline developability in a development step when used for production of a printed wiring board; and a resin sheet, a multilayer printed wiring board and a semiconductor device obtained using the resin composition.

Solution to Problem

The present inventors have found that the problems described above can be solved by using a resin composition comprising a particular bismaleimide compound (A), a compound (B) containing one or more carboxy groups, and a photo initiator (C), leading to completion of the present invention.

More specifically, the present invention includes the following contents.

[1] A resin composition comprising:
a bismaleimide compound (A) containing a constituent unit represented by the following formula (1), and maleimide groups at both ends of the molecular chain;
a compound (B) containing one or more carboxy groups; and
a photo initiator (C):

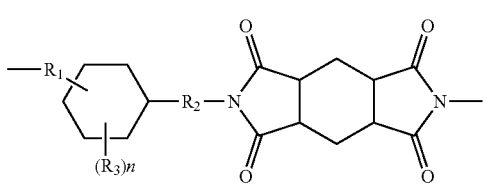
(1)

wherein $R_1$ represents a linear or branched alkylene group having 1 to 16 carbon atoms, or a linear or branched alkenylene group having 2 to 16 carbon atoms; $R_2$ represents a linear or branched alkylene group having 1 to 16 carbon atoms, or a linear or branched alkenylene group having 2 to 16 carbon atoms; each $R_3$ independently represents a hydrogen atom, a linear or branched alkyl group having 1 to 16 carbon atoms, or a linear or branched alkenyl group having 2 to 16 carbon atoms; and each n independently represents an integer of 1 to 10.

[2] The resin composition according to [1], wherein the compound (B) containing one or more carboxy groups is at least one compound selected from the group consisting of a compound represented by the following formula (2), a compound represented by the following formula (3), a compound represented by the following formula (4) and a compound represented by the following formula (5):

(2)

wherein each $R_4$ independently represents a hydrogen atom, a hydroxyl group, a carboxy group, an amino group or an aminomethyl group; each k independently represents an integer of 1 to 5; and when two or more carboxy groups are present, the carboxy groups are optionally linked together to form an acid anhydride, (3)

wherein each $R_5$ independently represents a hydrogen atom, a hydroxyl group, a carboxy group, a carboxymethyl group, an amino group or an aminomethyl group; each l independently represents an integer of 1 to 9; when two or more carboxy groups are present, the carboxy groups are optionally linked together to form an acid anhydride; and when a carboxymethyl group is present, the carboxymethyl group and the carboxy group are optionally linked together to form an acid anhydride, (4)

wherein each $R_6$ independently represents a hydrogen atom, a hydroxyl group, a carboxy group, a carboxymethyl group, an amino group or an aminomethyl group; each m independently represents an integer of 1 to 9; when two or more carboxy groups are present, the carboxy groups are optionally linked together to form an acid anhydride; and when a carboxymethyl group is present, the carboxymethyl group and the carboxy group are optionally linked together to form an acid anhydride, and

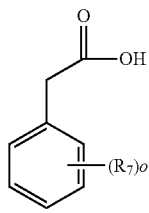

(5)

wherein each $R_7$ independently represents a hydrogen atom, a hydroxyl group, a carboxy group, a carboxymethyl group, an amino group or an aminomethyl group; and each o independently represents an integer of 1 to 5; when one or more carboxy groups are present, the carboxymethyl group and the carboxy group are optionally linked together to form an acid anhydride; when two or more carboxy groups are present, the carboxy groups are optionally linked together to form an acid anhydride; and when two or more carboxymethyl groups are present, the carboxymethyl groups are optionally linked together to form an acid anhydride.

[3] The resin composition according to [1] or [2], wherein the photo initiator (C) comprises a compound represented by the following formula (6):

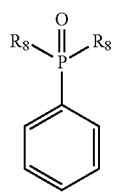

(6)

wherein each $R_8$ independently represents a substituent represented by the following formula (7) or a phenyl group; and

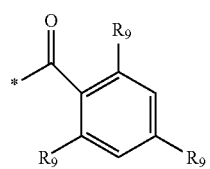

(7)

wherein -* represents a bonding hand, and each $R_9$ independently represents a hydrogen atom or a methyl group.

[4] A resin sheet comprising a support; and a resin layer disposed on one surface or both surfaces of the support, wherein the resin layer comprises the resin composition according to any of [1] to [3].

[5] The resin sheet according to [4], wherein the resin layer has a thickness of 1 to 50 μm.

[6] A multilayer printed wiring board comprising an insulation layer; and a conductor layer formed on one surface or both surfaces of the insulation layer, wherein the insulation layer comprises the resin composition according to any of [1] to [3].

[7] A semiconductor device comprising the resin composition according to any of [1] to [3].

Advantageous Effects of Invention

According to the present invention, it is possible to provide a resin composition which does not hinder photo-curing reaction and has excellent photocurability in an exposure step and is capable of imparting excellent alkaline developability in a development step when used for production of a multilayer printed wiring board; and a resin sheet, a multilayer printed wiring board and a semiconductor device obtained using the resin composition.

BRIEF DESCRIPTION OF DRAWING

FIG. 1 shows photographs after alkaline development performed with the use of resin sheets obtained using an active energy ray including a wavelength of 405 nm (h-line) in Example 1 and Comparative Example 1.

DESCRIPTION OF EMBODIMENT

Hereinafter, an embodiment for carrying out the present invention (hereinafter, referred to as the "present embodiment") will be described in detail. The present embodiment described below is only illustrative of the present invention and is not intended to limit the present invention to the contents of the following description. The present invention can be carried out with appropriate modifications falling within the gist of the invention.

Note that, in the present specification, the term "(meth)acryloxy" refers to both "acryloyloxy" and "methacryloxy" corresponding thereto, the term "(meth)acrylate" refers to both "acrylate" and "methacrylate" corresponding thereto, and the term "(meth)acryl" refers to both "acryl" and "methacryl" corresponding thereto.

[Resin Composition]

The resin composition of the present embodiment contains a particular bismaleimide compound (A), a compound (B) containing one or more carboxy groups, and a photo initiator (C). Hereinafter, each of these components will be described.

[Bismaleimide Compound (A)]

The resin composition of the present embodiment contains a bismaleimide compound (A) (also referred to as component (A)). The bismaleimide compound (A) contains a constituent unit represented by the formula (1), and maleimide groups at both ends of the molecular chain.

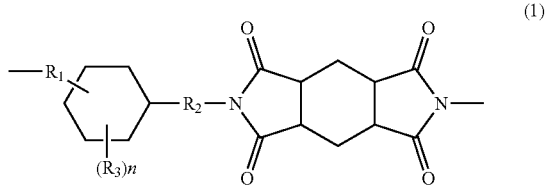

(1)

In the formula (1), $R_1$ represents a linear or branched alkylene group having 1 to 16 carbon atoms, or a linear or branched alkenylene group having 2 to 16 carbon atoms. $R_2$ represents a linear or branched alkylene group having 1 to 16 carbon atoms, or a linear or branched alkenylene group having 2 to 16 carbon atoms. Each $R_3$ independently represents a hydrogen atom, a linear or branched alkyl group having 1 to 16 carbon atoms, or a linear or branched alkenyl group having 2 to 16 carbon atoms. Each n independently represents an integer of 1 to 10.

Normally, since maleimide compounds have poor light transmissivity, when the resin composition contains a maleimide compound, light does not sufficiently reach the photo initiator dispersed in the resin composition, and the photo initiator has difficulty generating radicals. Therefore, in general, the photo radical reaction of maleimide compounds is difficult to proceed, and even if radical polymerization or dimerization reaction of single maleimide proceeds, its reactivity is very low. The bismaleimide compound (A) contains a constituent unit represented by the formula (1), and therefore has very excellent light transmittivity. Therefore, light reaches the photo initiator sufficiently, so that the photo radical reaction of the maleimide efficiently takes place. Using various active energy rays, the bismaleimide compound (A) can be photocured together with the later-described compound (B) containing one or more carboxy groups and the photo initiator (C).

In the present embodiment, the bismaleimide compound (A) exhibits very excellent light transmissivity, with a transmittance of 5% or more, when a chloroform solution containing the bismaleimide compound (A) at 1% by mass is prepared and the transmittance of the chloroform solution containing the bismaleimide compound (A) at 1% by mass is measured using an active energy ray including a wavelength of 365 nm (i-line). In addition, the bismaleimide compound (A) exhibits very excellent light transmissivity, with a transmittance of 5% or more, when the transmittance of the chloroform solution containing the bismaleimide compound (A) at 1% by mass is measured using an active energy ray (ray of light) including a wavelength of 405 nm (h-line). Therefore, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The transmittance at a wavelength of 365 nm (i-line) is preferably 8% or more, more preferably 10% or more, from the viewpoint of exhibiting superior light transmittivity. The transmittance at a wavelength of 405 nm (h-line) is preferably 8% or more, more preferably 10% or more, from the viewpoint of producing a printed wiring board having a more highly dense and highly detailed wiring formation (pattern). The upper limit of each of the transmittance at a wavelength of 365 nm (i-line) and the transmittance at a wavelength of 405 nm (h-line) is, for example, 99.9% or less.

Normally, the absorbance of the photo initiator tends to decrease when a ray of light having a long wavelength is used. For example, when an active energy ray including a wavelength of 405 nm (h-line) is used, a usual photo initiator does not absorb the ray because light having such a wavelength has a relatively long wavelength, and polymerization proceeds only when a photo initiator capable of suitably absorbing the light to generate radicals is used. Therefore, as the later-described photo initiator (C), a photo initiator is preferably used which exhibits very excellent absorption of light with a wavelength of 405 nm (h-line), with an absorbance of 0.1 or more, when the absorbance of a chloroform solution containing the photo initiator (C) at 0.01% by mass is measured.

Since the bismaleimide compound (A) has excellent light transmissivity as mentioned above, light reaches the photo initiator sufficiently, for example, even when an active energy ray including a wavelength of 365 nm or an active energy ray including a wavelength of 405 nm is used, radical reaction using radicals generated from the photo initiator proceeds, and even a composition containing a large amount of the bismaleimide compound (A) can be photocured.

In addition, normally, maleimide compounds have extremely low water solubility, do not have reactivity with an alkaline component in an alkaline developing solution, and therefore hardly exhibit alkaline developability. However, the resin composition of the present embodiment contains the photo initiator (C) together with the bismaleimide compound (A) and the later-described compound (B) containing one or more carboxy groups, and therefore has excellent alkaline developability while having excellent photocurability. The reason for this is not certain, but the present inventors estimate it as follows. That is, the bismaleimide compound (A) has a relatively long chain and a flexible structure, and does not have a structure which causes interaction with an alkaline component in the alkaline developing solution. Therefore, the bismaleimide compound (A) can be dissolved in the alkaline developing solution as the compound (B) is dissolved in the alkaline developing solution while the structure of the compound (B) containing one or more carboxy groups is maintained in the alkaline developing solution. When in a development step, the alkaline developing solution flows into an unexposed portion (resin composition), the alkaline component in the alkaline developing solution and a carboxy group in the compound (B) can quickly and suitably form a salt without being hindered by the bismaleimide compound (A). Thus, water-solubility is improved. This may be the reason why the resin composition of the present embodiment has excellent alkaline developability.

In addition, cured products obtained from the resin composition of the present embodiment have excellent heat resistance, insulation reliability and thermal stability, and according to the present embodiment, protective films and insulation layers in multilayer printed wiring boards and semiconductor devices can be suitably formed.

The mass average molecular weight of the bismaleimide compound (A) is preferably 100 to 5000, and more preferably 300 to 4500 because a suitable viscosity can be obtained and an increase in viscosity of varnish can be suppressed. In the present embodiment, the term "mass average molecular weight" means a mass average molecular weight in terms of polystyrene standard by a gel permeation chromatography (GPC) method.

The structure of the bismaleimide compound (A) will now be described.

In the formula (1) of the bismaleimide compound (A), $R_1$ represents a linear or branched alkylene group having 1 to 16 carbon atoms, or a linear or branched alkenylene group having 2 to 16 carbon atoms. $R_1$ is preferably a linear or branched alkylene group, and more preferably a linear alkylene group because a suitable viscosity can be obtained and an increase in viscosity of varnish can be controlled.

The number of carbon atoms in the alkylene group is preferably 2 to 14, and more preferably 4 to 12 because a more suitable viscosity can be obtained and an increase in viscosity of varnish can be more reliably controlled.

Examples of the linear or branched alkylene group include a methylene group, an ethylene group, a propylene group, a 2,2-dimethylpropylene group, a butylene group, a pentylene group, a hexylene group, a heptylene group, an octylene group, a nonylene group, a decylene group, a dodecylene group, an undecylene group, a tridecylene group, a tetradecylene group, a pentadecylene group, a hexadecylene group, a neopentylene group, a dimethylbutylene group, a methylhexylene group, an ethylhexylene group, a dimethylhexylene group, a trimethylhexylene group, a methylheptylene group, a dimethylheptylene group, a trimethylheptylene group, a tetramethylheptylene group, an ethylheptylene group, a methyloctylene group, a methylnonylene group, a methyldecylene group, a methyldodecylene group, a methylundecylene group, a methyltridecylene group, a methyltetradecylene group and a methylpentadecylene group.

The number of carbon atoms in the alkenylene group is preferably 2 to 14, and more preferably 4 to 12 because a more suitable viscosity can be obtained and an increase in viscosity of varnish can be more reliably controlled.

Examples of the linear or branched alkenylene group include a vinylene group, a 1-methylvinylene group, an arylene group, a propenylene group, an isopropenylene group, a 1-butenylene group, a 2-butenylene group, a 1-pentenylene group, a 2-pentenylene group, an isopentenylene group, a cyclopentenylene group, a cyclohexenylene group and a dicyclopentadienylene group.

In the formula (1), $R_2$ represents a linear or branched alkylene group having 1 to 16 carbon atoms, or a linear or branched alkenylene group having 2 to 16 carbon atoms. $R_2$ is preferably a linear or branched alkylene group, and more preferably a linear alkylene group because a suitable viscosity can be obtained and an increase in viscosity of varnish can be controlled.

The number of carbon atoms in the alkylene group is preferably 2 to 14, and more preferably 4 to 12 because a more suitable viscosity can be obtained and an increase in viscosity of varnish can be more reliably controlled.

For the linear or branched alkylene group, $R_1$ can be referred to.

The number of carbon atoms in the alkenylene group is preferably 2 to 14, and more preferably 4 to 12 because a more suitable viscosity can be obtained and an increase in viscosity of varnish can be more reliably controlled.

For the linear or branched alkenylene group, $R_1$ can be referred to.

In the formula (1), $R_1$ and $R_2$ may be the same or different, and are preferably the same because the bismaleimide compound (A) can be more easily synthesized.

In the formula (1), each $R_3$ independently represents a hydrogen atom, a linear or branched alkyl group having 1 to 16 carbon atoms, or a linear or branched alkenyl group having 2 to 16 carbon atoms. It is preferable that each $R_3$ be independently a hydrogen atom or a linear or branched alkyl group having 1 to 16 carbon atoms because a suitable viscosity can be obtained and an increase in viscosity of varnish can be controlled, it is more preferable that one to five groups ($R_3$s) among $R_3$s be linear or branched alkyl groups each having 1 to 16 carbon atoms, and other groups ($R_3$) be hydrogen atoms, and it is still more preferable that one to three groups ($R_3$s) among $R_3$s be linear or branched alkyl groups each having 1 to 16 carbon atoms, and other groups ($R_3$) be hydrogen atoms.

The number of carbon atoms in the alkyl group is preferably 2 to 14, and more preferably 4 to 12 because a more suitable viscosity can be obtained and an increase in viscosity of varnish can be more reliably controlled.

Examples of the linear or branched alkyl group include a methyl group, an ethyl group, a n-propyl group, an isopropyl group, a 1-ethylpropyl group, a n-butyl group, a 2-butyl group, an isobutyl group, a tert-butyl group, a n-pentyl group, a 2-pentyl group, a tert-pentyl group, a 2-methylbutyl group, a 3-methylbutyl group, a 2,2-dimethylpropyl group, a n-hexyl group, a 2-hexyl group, a 3-hexyl group, a n-heptyl group, a n-octyl group, a 2-methylpentyl group, a 3-methylpentyl group, a 4-methylpentyl group, a 2-methylpentan-3-yl group and a n-nonyl group.

The number of carbon atoms in the alkenyl group is preferably 2 to 14, and more preferably 4 to 12 because a more suitable viscosity can be obtained and an increase in viscosity of varnish can be more reliably controlled.

Examples of the linear or branched alkenyl group include a vinyl group, an allyl group, a 4-pentenyl group, an isopropenyl group, an isopentenyl group, a 2-heptenyl group, a 2-octenyl group and a 2-nonenyl group.

In the formula (1), each n independently represents an integer of 1 to 10.

The bismaleimide compound (A) has maleimide groups at both ends of the molecular chain. In the present embodiment, the term "both ends" means both ends of the molecular chain of the bismaleimide compound (A), and for example, when the structural unit represented by the formula (1) is present at an end of the molecular chain of the bismaleimide compound (A), the maleimide group is present at an end of the molecular chain of $R_1$, at an end of the molecular chain on the N atom of the maleimide ring, or at each of both the ends. The bismaleimide compound (A) may have maleimide groups at positions other than both ends of the molecular chain.

In the present embodiment, the maleimide group is represented by the formula (8), and the N atom is bonded to the molecular chain of the bismaleimide compound (A). In addition, the maleimide groups bonded to the bismaleimide compound (A) may be all the same or different, and the maleimide groups at both ends of the molecular chain are preferably the same.

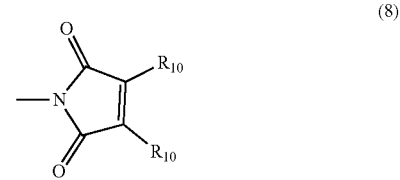

(8)

In the formula (8), each $R_{10}$ independently represents a hydrogen atom, or a linear or branched alkyl group having 1 to 4 carbon atoms. Each $R_{10}$ is preferably a hydrogen atom because photocuring is suitably performed.

The number of carbon atoms in the alkyl group is preferably 1 to 3, and more preferably 1 or 2 because photocuring is suitably performed.

For the linear or branched alkyl group, $R_3$ can be referred to.

Examples of such a bismaleimide compound A include a bismaleimide compound represented by the formula (9). One of these bismaleimide compounds can be used, or two or more thereof can be appropriately mixed and used.

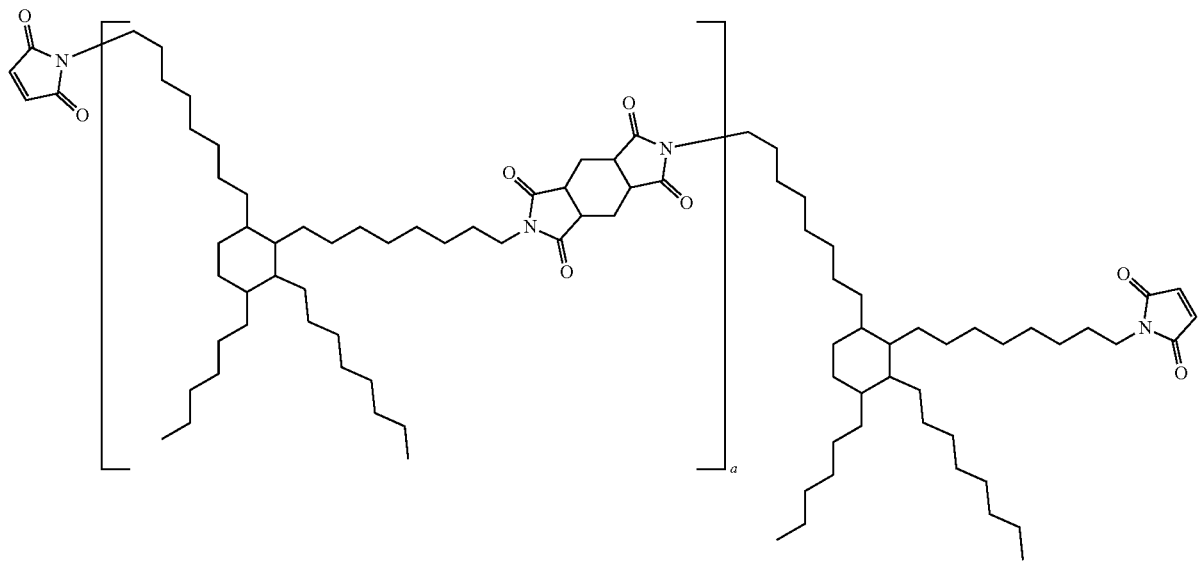

(9)

In the formula (9), a represents an integer of 1 to 10. a is preferably an integer of 1 to 6 because a more suitable viscosity can be obtained and an increase in viscosity of varnish can be more reliably controlled.

As the bismaleimide compound (A), commercial products can also be used. Examples of the commercial products include MIZ-001 manufactured by Nippon Kayaku Co., Ltd. (product name, containing the maleimide compound of the formula (9)).

In the resin composition of the present embodiment, the content of the bismaleimide compound (A) is preferably 40 to 99 parts by mass, more preferably 50 to 97 parts by mass, and still more preferably 60 to 96 parts by mass based on 100 parts by mass of the total of the bismaleimide compound (A), the later-described compound (B) containing one or more carboxy groups, and the later-described photo initiator (C), from the viewpoint that it becomes possible to obtain a cured product mainly composed of the bismaleimide compounds and photocurability is improved.

One of these bismaleimide compounds (A) can be used, or two or more thereof can be appropriately mixed and used.

(Method for Producing Bismaleimide Compound (A))

The bismaleimide compound (A) can be produced by a known method. For example, 1,2,4,5-cyclohexanetetracarboxylic dianhydride, a monomer containing a diamine including a dimer diamine or the like, and a maleic anhydride compound are subjected to a polyaddition reaction at a temperature of normally about 80 to 250° C., preferably about 100 to 200° C. for normally about 0.5 to 50 hours, preferably about 1 to 20 hours to obtain a polyaddition product, and the polyaddition product is then subjected to an imidization reaction, i.e. a ring closure reaction with dehydration at a temperature of normally about 60 to 120° C., preferably about 80 to 100° C. for normally about 0.1 to 2 hours, preferably about 0.1 to 0.5 hours to obtain the bismaleimide compound (A).

The dimer diamine can be obtained by, for example, a reductive amination reaction of a dimer acid, and the amination reaction can be conducted by, for example, a known method such as a reduction method using ammonia and a catalyst (e.g. the method described in Japanese Patent Laid-Open No. 9-12712). The dimer acid is a dibasic acid obtained by dimerization of an unsaturated fatty acid through an intermolecular polymerization reaction or the like. Depending on synthesis conditions and purification conditions, a small amount of monomer acids and trimer acids are normally contained in addition to the dimer acid. After the reaction, double bonds remain in the obtained molecule, and in the present embodiment, the dimer acids also include those formed into saturated dibasic acids by reduction of double bonds present in the molecule through a hydrogenation reaction. The dimer acid can be obtained by, for example, polymerizing an unsaturated fatty acid using Lewis acid and Broensted acid as catalysts. The dimer acid can be produced by a known method (e.g. the method described in Japanese Patent Laid-Open No. 9-12712). Examples of the unsaturated fatty acid include crotonic acid, myristoleic acid, palmitoleic acid, oleic acid, elaidic acid, vaccenic acid, gadoleic acid, eicosenoic acid, erucic acid, nervonic acid, linoleic acid, pinolenic acid, eleostearic acid, mead acid, dihomo-γ-linolenic acid, eicosatrienoic acid, stearidonic acid, arachidonic acid, eicosatetraenoic acid, adrenic acid, bosseopentaenoic acid, Osbond acid, clupanodonic acid, tetracosapentaenoic acid, docosahexaenoic acid and Nisinic acid. The number of carbon atoms in the unsaturated fatty acid is typically 4 to 24, and preferably 14 to 20.

In production of the bismaleimide compound (A), it is preferable that the monomer containing a diamine be dissolved or dispersed in a slurry form in an organic solvent in an inert atmosphere of, for example, argon, nitrogen or the like to form a monomer solution containing a diamine in advance. It is preferable that the 1,2,4,5-cyclohexanetetracarboxylic dianhydride be added to the monomer solution containing a diamine after being dissolved or dispersed in a slurry form in an organic solvent, or in a solid state.

A desired bismaleimide compound (A) can be obtained by adjusting the number of moles of the 1,2,4,5-cyclohexanetetracarboxylic dianhydride and the number of moles of the total amount of the monomer containing a diamine and the maleimide compound.

Various known solvents can be used for the polyaddition reaction and the imidization reaction. Examples of the solvent include amides such as N,N-dimethylformamide, N,N-dimethylacetamide and N-methyl-2-pyrrolidone; ketones such as acetone, methyl ethyl ketone, methyl isobutyl ketone, cyclohexanone and isophorone; esters such γ-butyrolactone, γ-valerolactone, δ-valerolactone, γ-caprolactone, ε-caprolactone, α-methyl-γ-butyrolactone, ethyl lactate, methyl acetate, ethyl acetate and butyl acetate; aliphatic alcohols having 1 to 10 carbon atoms such as methanol, ethanol and propanol; aromatic group-containing phenols such as phenol and cresol; aromatic group-containing alcohols such as benzyl alcohol; glycols such as ethylene glycol and propylene glycol, monoethers or diethers of these glycols and methanol, ethanol, butanol, hexanol, octanol, benzyl alcohol, phenol, cresol and the like, or glycol ethers such as esters of these monoethers; ethers such as dioxane and tetrahydrofuran; cyclic carbonates such as ethylene carbonate and propylene carbonate; aliphatic hydrocarbons and aromatic hydrocarbons such as toluene and xylene; and aprotic polar solvents such as dimethylsulfoxide. One of these solvents can be used, or two or more thereof can be combined and used as necessary.

It is preferable to use a catalyst in the imidization reaction. As the catalyst, for example, tertiary amines and dehydration catalysts can be used. The tertiary amine is preferably a heterocyclic tertiary amine, and examples thereof include pyridine, picoline, quinoline and isoquinoline. Examples of the dehydration catalyst include acetic anhydride, propionic anhydride, n-butyric anhydride, benzoic anhydride and trifluoroacetic anhydride.

For the amount of the catalyst added, it is preferable that for example, the amount of an imidizing agent be 0.5 to 5.0 times the amount of amide groups on a molar basis, and the amount of the dehydration catalyst be 0.5 to 10.0 times the amount of amide groups on a molar basis.

After completion of the imidization reaction, the solution may be used as a bismaleimide compound (A) solution, or a poor solvent may be added to the reaction solvent to form the bismaleimide compound (A) into a solid matter. Examples of the poor solvent include water, methyl alcohol, ethyl alcohol, 2-propyl alcohol, ethylene glycol, triethylene glycol, 2-butyl alcohol, 2-pentyl alcohol, 2-hexyl alcohol, cyclopentyl alcohol, cyclohexyl alcohol, phenol and t-butyl alcohol.

[Compound (B) Containing One or More Carboxy Groups]

The resin composition of the present embodiment contains the compound (B) containing one or more carboxy groups (also referred to as component (B) or compound (B)). The compound (B) is not particularly limited as long as it contains one or more carboxy groups in the compound. The carboxy group may be a salt such as a sodium salt or a potassium salt, and when two or more carboxy groups are contained in the molecule, the carboxy groups may be linked together to form an acid anhydride. One of the compounds (B) can be used, or two or more thereof can be appropriately mixed and used.

A cured product can be obtained by photocuring the compound (B) together with the bismaleimide compound (A) according to the present embodiment and the later-described photo initiator (C) using various active energy rays. In addition, according to the present embodiment, it is possible to obtain a resin composition containing the compound (B) in an unexposed portion.

The compound (B) has a transmittance of preferably 5% or more when a N-methylpyrrolidone solution containing the compound (B) at 1% by mass is prepared and the transmittance of the N-methylpyrrolidone solution containing the compound (B) at 1% by mass is measured using an active energy ray including a wavelength of 365 nm (i-line). Such a compound (B) exhibits very excellent light transmittivity. In addition, the compound (B) has a transmittance of preferably 5% or more when the transmittance of a N-methylpyrrolidone solution containing the compound (B) at 1% by mass is measured using an active energy ray including a wavelength of 405 nm (h-line). Even in this case, very excellent light transmittivity is exhibited. When such a compound (C) is used, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The transmittance at a wavelength of 365 nm (i-line) is preferably 8% or more, more preferably 10% or more, still more preferably 20% or more, even more preferably 30% or more, and furthermore preferably 40% or more because a resin composition that is superior in photocurability can be obtained. The transmittance at a wavelength of 405 nm (h-line) is preferably 8% or more, more preferably 10% or more, still more preferably 20% or more, even more preferably 30% or more, and furthermore preferably 40% or more because a resin composition that is superior in photocurability can be obtained. The upper limit of each of the transmittance at a wavelength of 365 nm (i-line) and the transmittance at a wavelength of 405 nm (h-line) is, for example, 99.9% or less, and may be 100% or less.

In the present embodiment, it is preferable that the molecule of the compound (B) contain n carboxy groups where n is an integer of 2 to 4 because superior alkaline developability can be obtained.

The molecular weight of the compound (B) is preferably 50 to 1000, and more preferably 100 to 800 because developability is further improved.

Examples of the compound (B) include formic acid, aliphatic compounds containing one or more carboxy groups, aromatic compounds containing one or more carboxy groups, and hetero compounds containing one or more carboxy groups. One of these compounds (B) can be used, or two or more thereof can be appropriately mixed and used.

(Aliphatic Compound Containing One or More Carboxy Groups)

Examples of the aliphatic compound containing one or more carboxy groups include chain aliphatic monocarboxylic acids, alicyclic monocarboxylic acids, chain aliphatic polyvalent carboxylic acids and alicyclic polyvalent carboxylic acids. These compounds may have hydrogen atoms and substituents such as alkyl groups, alkoxy groups, aryloxy groups, aryl groups, aminoalkyl groups, hydroxyl groups, amino groups and carboxyalkyl groups in the molecule. When these compounds have two or more carboxy groups in the molecule, the carboxy groups may be linked together to form an acid anhydride. When these compounds have a carboxyalkyl group in the molecule, the carboxyalkyl group and the carboxy group may be linked together to form an acid anhydride. When these compounds have two or more carboxyalkyl groups in the molecule, the carboxy groups may be linked together to form an acid anhydride.

Examples of the alkyl group include a methyl group, an ethyl group, a n-propyl group, an i-propyl group, a butyl group, an isobutyl group, a sec-butyl group, a tert-butyl group, a n-pentyl group, a n-hexyl group, a n-heptyl group and a n-octyl group.

Examples of the alkoxy group include a methoxy group, an ethoxy group, a propoxy group, an isopropoxy group, a n-butoxy group, an isobutoxy group, a tert-butoxy group, n-hexanoxy group and a 2-methylpropoxy group.

Examples of the aryloxy group include a phenoxy group and a p-tolyloxy group.

Examples of the aryl group include a phenyl group, a toluyl group, a benzyl group, a methylbenzyl group, a xylyl group, a mesityl group, a naphthyl group and an anthryl group.

Examples of the aminoalkyl group include an aminomethyl group, an aminoethyl group, an aminopropyl group, an aminodimethyl group, an aminodiethyl group, an aminodipropyl group, an aminobutyl group, an aminohexyl group and an aminononyl group.

Examples of the carboxyalkyl group include a carboxymethyl group, a carboxyethyl group, a carboxypropyl group, a carboxybutyl group, a carboxyhexyl group and a carboxynonyl group.

Examples of the chain aliphatic monocarboxylic acid include saturated fatty acids such as acetic acid, propionic acid, isobutyric acid, butyric acid, isovaleric acid, valeric acid, caproic acid, lactic acid, succinic acid, octanoic acid, nonanoic acid, decanoic acid, dodecanoic acid, tetradecanoic acid, hexadecanoic acid, heptadecanoic acid and octadecanoic acid, and unsaturated fatty acids such as oleic acid, elaidic acid, erucic acid, nervonic acid, linolenic acid, stearidonic acid, eicosapentanoeic acid, linoleic acid and linolenic acid.

Examples of the alicyclic monocarboxylic acid include monocyclic carboxylic acids such as cyclopropanecarboxylic acid, cyclopropenecarboxylic acid, cyclobutanecarboxylic acid, cyclobutenecarboxylic acid, cyclopentanecarboxylic acid, cyclopentenecarboxylic acid, cyclohexanecarboxylic acid, cyclohexenecarboxylic acid, cycloheptanecarboxylic acid, cycloheptenecarboxylic acid, cyclooctanecarboxylic acid and cyclooctenecarboxylic acid, and polycyclic or bridged alicyclic carboxylic acids such as norbornanecarboxylic acid, tricyclodecanecarboxylic acid, tetracyclododecanecarboxylic acid, adamantanecarboxylic acid, methyladamantanecarboxylic acid, ethyladamantanecarboxylic acid and butyladamantanecarboxylic acid.

Examples of the chain aliphatic polyvalent carboxylic acid include carboxylic acids in which one or more carboxy groups are further added to a chain aliphatic monocarboxylic acid. Examples thereof include propionedioic acid, octanedioic acid, nonanedioic acid, decanedioic acid, dodecanedioic acid, tetradecanedioic acid, hexadecanedioic acid, heptadecanedioic acid and octadecanedioic acid.

Examples of the aliphatic polyvalent carboxylic acid include carboxylic acids in which one or more carboxy groups are further added to an alicyclic monocarboxylic acid. Examples thereof include monocyclic carboxylic acids such as cyclopropanedicarboxylic acid, cyclopropenedicarboxylic acid, cyclopropanetricarboxylic acid, cyclopropenetricarboxylic acid, cyclobutanedicarboxylic acid, cyclobutenedicarboxylic acid, cyclobutanetricarboxylic acid, cyclobutenetricarboxylic acid, cyclobutanetetracarboxylic acid, cyclobutenetetracarboxylic acid, cyclopentanedicarboxylic acid, cyclopentenedicarboxylic acid, cyclopentanetricarboxylic acid, cyclopentenetricarboxylic acid, cyclopentanetetracarboxylic acid, cyclopentenetetracarboxylic acid, cyclohexanedicarboxylic acid, cyclohexenedicarboxylic acid, cyclohexanetricarboxylic acid, cyclohexenetricarboxylic acid, cyclohexanetetraboxylic acid, cyclohexenetetracarboxylic acid, cyclohexanepentacarboxylic acid, cyclohexenepentacarboxylic acid, cyclohexanehexacarboxylic acid, cyclohexenehexacarboxylic acid, cycloheptanedicarboxylic acid, cycloheptenedicarboxylic acid, cyclooctanedicarboxylic acid and cyclooctenedicarboxylic acid, and polycyclic or bridged alicyclic carboxylic acids such as norbornanedicarboxylic acid and adamantanedicarboxylic acid.

(Aromatic Compound Containing One or More Carboxy Groups)

Examples of the main backbone of the aromatic compound containing one or more carboxy groups include benzoic acid, phenyleneacetic acid, salicylic acid, phthalic acid, trimellitic acid, pyromellitic acid, pentacarboxybenzene, hexacarboxybenzene, naphthalenecarboxylic acid, naphthalenedicarboxylic acid, naphthalenetricarboxylic acid, naphthalenetetracarboxylic acid, anthracenecarboxylic acid, anthracenedicarboxylic acid, anthracenetricarboxylic acid, anthracenetetracarboxylic acid and anthracenepentacarboxylic acid. The aromatic compound may have, for example, hydrogen atoms and substituents such as alkyl groups, alkoxy groups, aryloxy groups, aryl groups, aminoalkyl groups, hydroxyl groups, amino groups and carboxyalkyl groups on the aromatic ring of the main backbone. When these compounds have two or more carboxy groups in the molecule, the carboxy groups may be linked together to form an acid anhydride. When these compounds have a carboxyalkyl group in the molecule, the carboxyalkyl group and the carboxy group may be linked together to form an acid anhydride. When these compounds have two or more carboxyalkyl groups in the molecule, the carboxy groups may be linked together to form an acid anhydride. For these substituents, those described above can be referred to.

(Hetero Compound Containing One or More Carboxy Groups)

Examples of the main backbone of the hetero compound containing one or more carboxy groups include compounds containing one or more carboxy groups on hetero rings such as furan, thiophene, pyrrole, imidazole, pyran, pyridine, pyrimidine, pyrazine, pyrrolidine, piperidine, piperazine, morpholine, indole, purine, quinoline, isoquinoline, quinuclidine, chromene, thianthrene, phenothiazine, phenoxazine, xanthene, acridine, phenazine and carbazole. The hetero compound may have, for example, hydrogen atoms and substituents such as alkyl groups, alkoxy groups, aryloxy groups, aryl groups, aminoalkyl groups, hydroxyl groups, amino groups and carboxyalkyl groups on the main backbone. When these compounds have two or more carboxy groups in the molecule, the carboxy groups may be linked together to form an acid anhydride. When these compounds have a carboxyalkyl group in the molecule, the carboxyalkyl group and the carboxy group may be linked together to form an acid anhydride. When these compounds have two or more carboxyalkyl groups in the molecule, the carboxyalkyl groups may be linked together to form an acid anhydride. For these substituents, those described above can be referred to.

The compound (B) is preferably any of a compound represented by the formula (2), a compound represented by the formula (3), a compound represented by the formula (4) and a compound represented by the formula (5), in view of imparting superior alkaline developability to the resin composition.

The compound represented by the formula (2) is as follows.

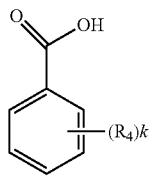

(2)

In the formula (2), each $R_4$ independently represents a hydrogen atom, a hydroxyl group, a carboxy group, an amino group or an aminomethyl group. When the compound represented by the formula (2) has two or more carboxy groups, the carboxy groups may be linked together to form an acid anhydride. In the formula (2), the upper limit of the number of carboxy groups is 6.

Each $R_4$ is independently preferably a hydrogen atom, a hydroxyl group, a carboxy group or an amino group from the viewpoint of alkaline developability, and more preferably includes a carboxy group because superior alkaline developability can be obtained.

The benzoic acid tends to be inferior in alkaline developability to the compound (B) containing one or more other carboxy groups.

Each k independently represents an integer of 1 to 5.

The compound represented by the formula (2) is preferably a compound represented by the formula (10) because superior alkaline developability can be obtained.

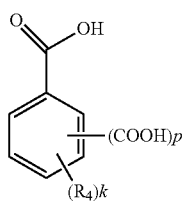

(10)

In the formula (10), each $R_4$ independently represents a hydrogen atom, a hydroxyl group, an amino group or an aminomethyl group. $R_4$ is preferably a hydrogen atom or a hydroxyl group, and more preferably a hydrogen atom because superior alkaline developability is exhibited.

Each k independently represents an integer of 0 to 4.

The number of carboxy groups (p) is an integer of 5-k. The number of carboxy groups (p) is preferably an integer of 1 to 3 because superior alkaline developability is exhibited. In this case, the number of $R_4$s (k) is an integer of 5-p, which is an integer of 2 to 4.

The compound represented by the formula (10) may contain two or more carboxy groups, with the carboxy groups being linked together to form an acid anhydride.

Examples of the compound represented by the above formula (2) include 4-aminobenzoic acid, salicylic acid, phthalic acid, trimellitic acid, pyromellitic acid, 4-aminomethylbenzoic acid and anhydrides thereof. Examples of these anhydrides include phthalic anhydride, trimellitic anhydride and pyromellitic anhydride. The compound represented by the formula (2) is preferably any of phthalic acid, trimellitic acid, pyromellitic acid and anhydrides thereof because superior alkaline developability can be obtained.

The compound represented by the formula (3) is as follows.

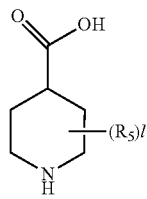

(3)

In the formula (3), each $R_5$ independently represents a hydrogen atom, a hydroxyl group, a carboxy group, a carboxymethyl group, an amino group or an aminomethyl group. When the compound represented by the formula (3) has two or more carboxy groups, the carboxy groups may be linked together to form an acid anhydride. In the formula (3), the upper limit of the number of carboxy groups is 10. When the compound represented by the formula (3) has a carboxymethyl group, the carboxymethyl group and the carboxy group may be linked together to form an acid anhydride.

Each $R_5$ is independently preferably a hydrogen atom, a hydroxyl group, a carboxy group or an amino group from the viewpoint of alkaline developability, and more preferably includes a carboxy group because superior alkaline developability can be obtained.

Each l independently represents an integer of 1 to 9.

The piperidinecarboxylic acid tends to be inferior in alkaline developability to the compound (B) containing one or more other carboxy groups.

When a carboxy group is contained as $R_5$, the number of carboxy groups (l) is preferably 1 to 3 from the viewpoint of alkaline developability. Each $R_5$ other than carboxy groups is independently preferably a hydrogen atom or a hydroxyl group, and more preferably a hydrogen atom. When the compound represented by the formula (3) contains one to three carboxy groups, the number of $R_5$s other than carboxy groups is 7 to 9.

Examples of the compound represented by the formula (3) include piperidinecarboxylic acid, 1,2-piperidinecarboxylic acid and piperidinedicarboxylic anhydride.

The compound represented by the formula (4) is as follows.

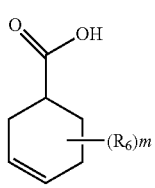

(4)

In the formula (4), each $R_6$ independently represents a hydrogen atom, a hydroxyl group, a carboxy group, a carboxymethyl group, an amino group or an aminomethyl group. When the compound represented by the formula (4) has two or more carboxy groups, the carboxy groups may be linked together to form an acid anhydride. In the formula (4), the upper limit of the number of carboxy groups is 10. When the compound represented by the formula (4) has a carboxymethyl group, the carboxymethyl group and the carboxy group may be linked together to form an acid anhydride.

Each $R_6$ is independently preferably a hydrogen atom, a hydroxyl group, a carboxy group or an amino group from the viewpoint of alkaline developability, and more preferably includes a carboxy group because superior alkaline developability can be obtained.

Each m independently represents an integer of 1 to 9.

The compound represented by the formula (4) is preferably a compound represented by the formula (11) because superior alkaline developability can be obtained.

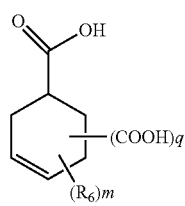

(11)

In the formula (11), each $R_6$ independently represents a hydrogen atom, a hydroxyl group, a carboxymethyl group, an amino group or an aminomethyl group. $R_6$ is preferably a hydrogen atom or a hydroxyl group, and more preferably a hydrogen atom because superior alkaline developability is exhibited.

Each m independently represents an integer of 0 to 8.

The number of carboxy groups (q) is an integer of 9-m. The number of carboxy groups (q) is preferably an integer of 1 to 3 because superior alkaline developability is exhibited. In this case, the number of $R_6$s (m) is an integer of 9-q, which is an integer of 6 to 8.

The compound represented by the formula (11) may contain two or more carboxy groups, with the carboxy groups being linked together to form an acid anhydride. When the compound represented by the formula (11) has a carboxymethyl group, the carboxymethyl group and the carboxy group may be linked together to form an acid anhydride.

Examples of the compound represented by the formula (4) include 3-cyclohexene-1-carboxylic acid, cis-4-cyclohexene-1,2-dicarboxylic acid and cis-4-cyclohexene-1,2-dicarboxylic anhydride. The compound represented by the formula (4) is preferably any of cis-4-cyclohexene-1,2-dicarboxylic acid and cis-4-cyclohexene-1,2-dicarboxylic anhydride because superior alkaline developability can be obtained.

The compound represented by the formula (5) is as follows.

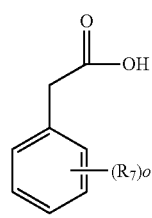

(5)

In the formula (5), each $R_7$ independently represents a hydrogen atom, a hydroxyl group, a carboxy group, a carboxymethyl group, an amino group or an aminomethyl group. When the compound represented by the formula (5) has one or more carboxy groups, the carboxymethyl group and the carboxy group may be linked together to form an acid anhydride. In the formula (5), when two or more carboxy groups are present, the carboxy groups are optionally linked together to form an acid anhydride. In the formula (5), the upper limit of the number of carboxy groups is 5. In the formula (5), when two or more carboxymethyl groups are present, the carboxymethyl groups are optionally linked together to form an acid anhydride. In the formula (5), the upper limit of the number of carboxymethyl groups is 6.

Each $R_7$ is independently preferably a hydrogen atom, a hydroxyl group, a carboxy group or an amino group from the viewpoint of alkaline developability, and more preferably includes a carboxy group because superior alkaline developability can be obtained.

Each o independently represents an integer of 1 to 5.

The compound represented by the formula (5) is preferably a compound represented by the formula (12) because superior alkaline developability can be obtained.

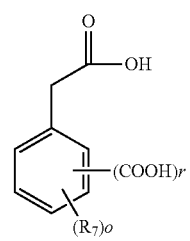

(12)

In the formula (12), each $R_7$ independently represents a hydrogen atom, a hydroxyl group, a carboxymethyl group, an amino group or an aminomethyl group. $R_7$ is preferably a hydrogen atom or a hydroxyl group, and more preferably a hydrogen atom because superior alkaline developability is exhibited.

Each o independently represents an integer of 0 to 4.

The number of carboxy groups (r) is an integer of 5-o. The number of carboxy groups (r) is preferably an integer of 1 to 3 because superior alkaline developability is exhibited. In this case, the number of Res (o) is an integer of 5-r, which is an integer of 2 to 4.

In the formula (12), the carboxymethyl group and the carboxy group may be linked together to form an acid anhydride. When the compound represented by the formula (12) has two or more carboxy groups, the carboxy groups may be linked together to form an acid anhydride. In the formula (12), the upper limit of the number of carboxy groups is 5. When the compound represented by the formula (12) has two or more carboxymethyl groups, the carboxymethyl groups may be linked together to form an acid anhydride. In the formula (12), the upper limit of the number of carboxymethyl groups is 6.

Examples of the compound represented by the above formula (5) include phenyleneacetic acid, 1,2-phenylenediacetic acid, 1,3-phenylenediacetic acid, 1,4-phenylenediacetic acid and anhydrides thereof. Examples of these anhydrides include 1,2-phenylenediacetic anhydride. The compound represented by the formula (5) is preferably a 1,2-phenylenediacetic acid because superior alkaline developability can be obtained.

One of these compounds (B) containing one or more carboxy groups can be used, or two or more thereof can be appropriately mixed and used.

In the resin composition of the present embodiment, the content of the compound (B) containing one or more carboxy groups is preferably 0.01 to 35 parts by mass, more preferably 1 to 30 parts by mass, and still more preferably 2 to 25 parts by mass based on 100 parts by mass of the total of the bismaleimide compound (A), the compound (B) containing one or more carboxy groups, and the later-described photo initiator (C) because superior alkaline developability can be imparted to the resin composition.

[Photo Initiator (C)]

The resin composition of the present embodiment contains the photo initiator (C) (also referred to as component (C)). The photo initiator (C) is not particularly limited, and photo initiators can be used which are publicly known in fields where photo initiators are generally used for photocurable resin compositions. The photo initiator (C) can be photocured together with the bismaleimide compound (A) and the compound (B) containing one or more carboxyl groups using various active energy rays.

Examples of the photo initiator (C) include radical type photo initiators such as benzoins such as benzoin, benzoin methyl ether, benzoin ethyl ether, benzoin isopropyl ether and benzoin isobutyl ether; organic peroxides exemplified by benzoyl peroxide, lauroyl peroxide, acetyl peroxide, parachlorobenzoyl peroxide, di-tert-butyl-di-perphthalate and the like; phosphine oxides such as 2,4,6-trimethylbenzoyl-diphenyl-phosphine oxide, bis(2,4,6-trimethylbenzoyl)-phenylphosphine oxide, benzoyl-diphenyl-phosphine oxide and bisbenzoyl-phenyphosphine oxide; acetophenones such as acetophenone, 2,2-diethoxy-2-phenylacetophenone, 2,2-diethoxy-2-phenylacetophenone, 1,1-dichloroacetophenone, 2-hydroxy-2-methyl-phenylpropan-1-one, diethoxyacetophenone, 1-hydroxycyclohexylphenylketone, 2-methyl-1-[4-(methylthio)phenyl]-2-morpholino-propan-1-one and 2-benzyl-2-dimethylamino-1-(4-morpholinophenyl)-butanone-1; anthraquinones such as 2-ethylanthraquinone, 2-t-butylanthraquinone, 2-chloroanthraquinone and 2-amylanthraquinone; thioxanthones such as 2,4-diethylthioxanthone, 2-isopropylthioxanthone and 2-chlorothioxanthone; ketals such as acetophenone dimethyl ketal and benzyl dimethyl ketal; benzophenones such as benzophenone, 4-benzoyl-4'-methyldiphenyl sulfide and 4,4'-bismethylaminobenzophenone; and oxime esters such as 1,2-octanedione, 1-[4-(phenylthio)-, 2-(O-benzoyloxime)] and ethanone, 1-[9-ethyl-6-(2-methylbenzoyl)-9H-carbazol-3-yl]-, 1-(O-acetyloxime);

diazonium salts of Lewis acid such as p-methoxyphenyldiazonium fluorophosphonate and N,N-diethylaminophenyldiazonium hexafluorophosphonate; iodonium salts of Lewis acid such as diphenyliodonium hexafluorophosphonate and diphenyliodonium hexafluoroantimonate; sulfonium salts of Lewis acid such as triphenylsulfonium hexafluorophosphonate and triphenylsulfonium hexafluoroantimonate; phosphonium salts of Lewis acid such as triphenylphosphonium hexafluoroantimonate; additional halides; triazine-based initiators; borate-based initiators; and cationic photo initiators such as additional photoacid generator.

As the photo initiator(C), commercial products can also be used. Examples of the commercial product include Omnirad (registered trademark) 369 (product name) manufactured by IGM Resins B.V., Omnirad (registered trademark) 819 (product name) manufactured by IGM Resins B.V., Omnirad (registered trademark) 819DW (product name) manufactured by IGM Resins B.V., Omnirad (registered trademark) 907 (product name) manufactured by IGM Resins B.V., Omnirad (registered trademark) TPO (product name) manufactured by IGM Resins B.V., Omnirad (registered trademark) TPO-G (product name) manufactured by IGM Resins B.V., Omnirad (registered trademark) 784 (product name) manufactured by IGM Resins B.V., Irgacure (registered trademark) OXE01 (product name) manufactured by BASF Japan Ltd., Irgacure (registered trademark) OXE02 (product name) manufactured by BASF Japan Ltd., Irgacure (registered trademark) OXE03 (product name) manufactured by BASF Japan Ltd., and Irgacure (registered trademark) OXE04 (product name) manufactured by BASF Japan Ltd.

One of the photo initiators (C) can be used, or two or more thereof can be appropriately mixed and used.

In the present embodiment, the photo initiator (C) has an absorbance of preferably 0.1 or more when a chloroform solution containing the photo initiator (C) at 0.01% by mass is prepared, and the absorbance of the chloroform solution containing the photo initiator (C) at 0.01% by mass is measured using an active energy ray including a wavelength of 365 nm (i-line). In this case, the photo initiator (C) exhibits very excellent light absorption. In addition, the photo initiator (C) has an absorbance of preferably 0.1 or more when the absorbance of a chloroform solution containing the photo initiator (C) at 0.01% by mass is measured using an active energy ray including a wavelength of 405 nm (h-line). Even in this case, very excellent light absorption is exhibited. When such a photo initiator (C) is used, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The absorbance at a wavelength of 365 nm (i-line) is more preferably 0.15 or more because a resin composition that is superior in photocurability can be obtained. The absorbance at a wavelength of 405 nm (h-line) is more preferably 0.15 or more because a resin composition that is superior in photocurability can be obtained. The upper limit of each of the absorbance at a wavelength of 365 nm (i-line) and the absorbance at a wavelength of 405 nm (h-line) is, for example, 99.9 or less.

As such a photo initiator (C), a compound represented by the formula (6) is preferable.

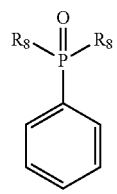

(6)

In the formula (6), each $R_8$ independently represents a substituent represented by the formula (7) or a phenyl group; and

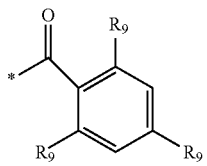

(7)

In the formula (7), each $R_9$ independently represent a hydrogen atom or a methyl group. In the formula (7), -* indicates a bonding hand to a phosphorus atom (P) in the formula (6).

As for the compound represented by the formula (6), when a chloroform solution containing this compound at 0.01% by mass is prepared and the absorbance of this chloroform solution is measured using an active energy ray including a wavelength of 365 nm (i-line), the absorbance is 0.1 or more, exhibiting very excellent absorption of the light with a wavelength of 365 nm (i-line). Therefore, this compound suitably generates radicals in response to the light with a wavelength of 365 nm (i-line). The absorbance is preferably 0.15 or more. The upper limit value is, for example, 10.0 or less, and may be 5.0 or less, or 2.0 or less.

As for the compound represented by the formula (6), when a chloroform solution containing this compound at 0.01% by mass is prepared and the absorbance of this chloroform solution is measured using an active energy ray including a wavelength of 405 nm (h-line), the absorbance is 0.1 or more, exhibiting very excellent absorption of the light with a wavelength of 405 nm (h-line). Therefore, this compound suitably generates radicals in response to the light with a wavelength of 405 nm (h-line). The absorbance is preferably 0.15 or more. The upper limit value is, for example, 10.0 or less, and may be 5.0 or less, or 2.0 or less.

In the formula (6), each $R_8$ independently represents a substituent represented by the formula (7) or a phenyl group. It is preferable that one or more among $R_8$s be the substituents represented by the formula (7).

In the formula (7), each $R_9$ independently represent a hydrogen atom or a methyl group. It is preferable that one or more among $R_9$s be methyl groups, and it is more preferable that all should be methyl groups.

Examples of the compound represented by the formula (6) include acylphosphine oxides such as 2,4,6-trimethylbenzoyl-diphenyl-phosphine oxide and bis(2,4,6-trimethylbenzoyl)-phenylphosphine oxide. Of these, bis(2,4,6-trimethylbenzoyl)-phenylphosphine oxide is preferable because it has excellent light transmittivity. One of these compounds can be used, or two or more thereof can be appropriately mixed and used.

Acylphosphine oxides exhibit very excellent absorption of an active energy ray including a wavelength of 405 nm (h-line) and can suitably radical polymerize the bismaleimide compound (A) having a transmittance of, for example, 5% or more at a wavelength of 405 nm (h-line). Therefore, it is possible to suitably produce a resin composition which does not hinder photocuring reaction and has excellent photocurability in an exposure step and is capable of imparting excellent alkaline developability in a development step when used for production of a multilayer printed wiring board; and a resin sheet, a multilayer printed wiring board and a semiconductor device obtained using the resin composition.

In the resin composition of the present embodiment, the content of the photo initiator (C) is preferably 0.99 to 25 parts by mass, more preferably 2 to 20 parts by mass, and still more preferably 2 to 15 parts by mass based on 100 parts by mass of the total of the bismaleimide compound (A), the compound (B) containing one or more carboxy groups and the photo initiator (C) from the viewpoint that photocuring of the maleimide compound sufficiently proceeds and the exposed portion is sufficiently insolubilized in alkaline developability.

[Maleimide Compound (D) Other than Bismaleimide Compound (A)]

The resin composition of the present embodiment may contain a maleimide compound (D) other than the bismaleimide compound (A) according to the present embodiment (also referred to as component (D)) as long as the effect of the present invention is achieved. The bismaleimide compound (A) has very excellent light transmittivity, so that even when the maleimide compound (D) is used, light reaches the photo initiator sufficiently, the photo radical reaction of the maleimide efficiently takes place, and photocuring can be performed using various active energy rays. Therefore, light reaches the photo initiator sufficiently, for example, even when an active energy ray including a wavelength of 365 nm or an active energy ray including a wavelength of 405 nm is used, radical reaction using radicals generated from the photo initiator proceeds, and even a composition containing the maleimide compound (D) can be photocured. The maleimide compound (D) will be described below.

The maleimide compound (D) used is not particularly limited as long as it is a compound other than the maleimide compound (A) and has one or more maleimide groups in the molecule. Specific examples thereof include N-phenylmaleimide, N-cyclohexylmaleimide, N-hydroxyphenylmaleimide, N-anilinodiphenylmaleimide, N-carboxyphenylmaleimide, N-(4-carboxy-3-hydroxyphenyl)maleimide, 6-maleimidohexanoic acid, 4-maleimidobutyric acid, bis(4-maleimidophenyl)methane, 2,2-bis{4-(4-maleimidophenoxy)-phenyl}propane, 4,4-diphenylmethanebismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethanemaleimide, o-phenylenebismaleimide, m-phenylenebismaleimide, p-phenylenebismaleimide, o-phenylenebiscitraconimide, m-phenylenebiscitraconimide, p-phenylenebiscitraconimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,2-bis(maleimido)ethane, 1,4-bis(maleimido)butane, 1,5-bis(maleimido)pentane, 1,5-bismalleimide-2-methylpentane, 1,6-bis(maleimido)hexane, 1,6-bismaleimido-(2,2,4-trimethyl)hexane, 1,8-bismaleimido-3,6-dioxaoctane, 1,11-bismaleimido-3,6,9-trioxaundecane, 1,3-bis(maleimidomethyl)cyclohexane, 1,4-bis(maleimidomethyl)cyclohexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethanemaleimide, a maleimide compound represented by the formula (13) such as polyphenylmethanemaleimide, a maleimide compound represented by the formula (14), fluorescein-5-maleimide, as well as a prepolymer of these maleimide compounds, or a prepolymer of maleimide compounds and amine compounds. One of these maleimide compounds (D) can be used, or two or more thereof can be appropriately mixed and used.

As the maleimide compound represented by the formula (13), commercial products can also be used. Examples thereof include (BMI-2300 (product name) manufactured by Daiwakasei Industry Co., LTD.). As the maleimide compound represented by the formula (14), commercial products can also be used. Examples thereof include (MIR-3000 (product name) manufactured by Nippon Kayaku Co., Ltd.).

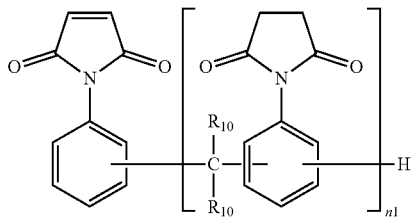
(13)

In the formula (13), each $R_{10}$ independently represent a hydrogen atom or a methyl group. $n_1$ represents an integer of 1 or more, preferably represents an integer of 1 to 10, and more preferably represents an integer of 1 to 5.

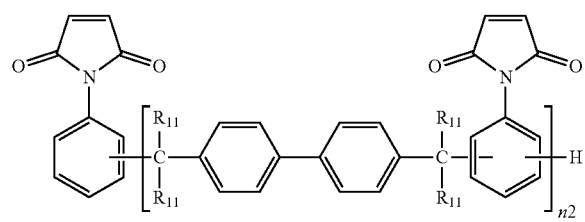
(14)

In the formula (14), each $R_{11}$ independently represent a hydrogen atom or a methyl group. $n_2$ represents an integer of 1 or more and preferably represents an integer of 1 to 5.

In the present embodiment, for the photo radical reaction of the bismaleimide compound (A) to occur efficiently, it is preferable that the maleimide compound (D) exhibit light transmittivity with a transmittance of 5% or more when a chloroform solution containing the maleimide compound (D) at 1% by mass is prepared and the transmittance of the chloroform solution is measured using an active energy ray including a wavelength of 365 nm (i-line). The transmittance in this case is more preferably 8% or more, and still more preferably 10% or more.

In the present embodiment, for the photo radical reaction of the bismaleimide compound (A) to occur efficiently, it is preferable that the maleimide compound (D) exhibit light transmittivity with a transmittance of 5% or more when a chloroform solution containing the maleimide compound (D) at 1% by mass is prepared and the transmittance of the chloroform solution is measured using an active energy ray including a wavelength of 405 nm (h-line). When such a maleimide compound (D) is used, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The light transmittance is preferably 8% or more, and more preferably 10% or more, because a resin composition that is superior in photocurability can be obtained.

Examples of the maleimide compound (D) include, a maleimide compound represented by the formula (15), a maleimide compound represented by the formula (16), a maleimide compound represented by the formula (17) such as a maleimide compound represented by the formula (23), a maleimide compound represented by the formula (18), a maleimide compound represented by the formula (19), a maleimide compound represented by the formula (20), 1,6-bismaleimide-(2,2,4-trimethyl)hexane (a maleimide compound represented by the formula (21)), a maleimide compound represented by the formula (22), and fluorescein-5-maleimide.

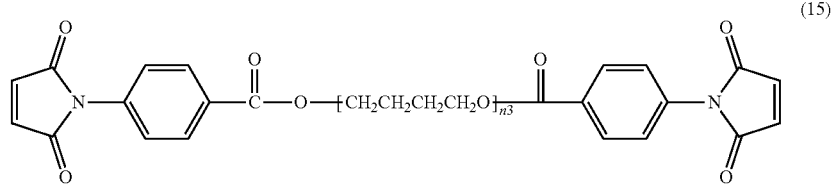
(15)

In the formula (15), $n_3$ (average) is 1 or more, preferably 1 to 21, and from the viewpoint of exhibiting excellent photocurability, more preferably 1 to 16.

above, since excellent photocurability is exhibited, a 2-heptenyl group, a 2-octenyl group, and a 2-nonenyl group are preferable, and a 2-octenyl group is more preferable.

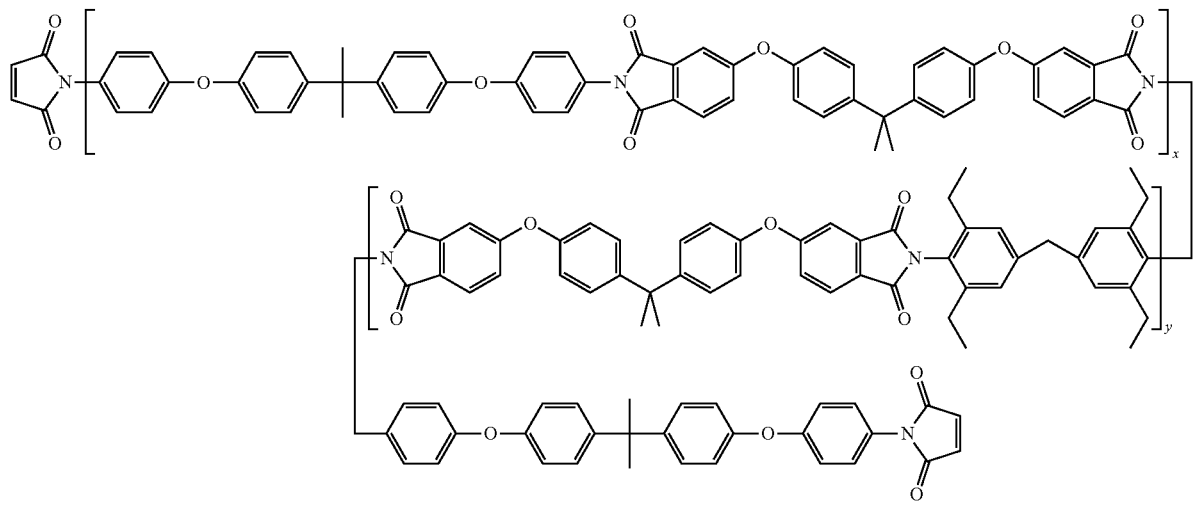

(16)

In the formula (16), the value of x is 10 to 35.
In the formula (16), the value of y is 10 to 35.

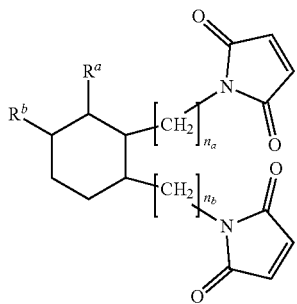

(17)

In the formula (17), $R^a$ represents a linear or branched alkyl group having 1 to 16 carbon atoms, or a linear or branched alkenyl group having 2 to 16 carbon atoms. $R^a$ is preferably a linear or branched alkyl group, and more preferably a linear alkyl group because excellent photocurability is exhibited.

The number of carbon atoms in the alkyl group is preferably 4 to 12 because excellent photocurability is exhibited.

The number of carbon atoms in the alkenyl group is preferably 4 to 12 because excellent photocurability is exhibited.

For the linear or branched alkyl group, $R_3$ in the bismaleimide compound (A) can be referred to. Among the above, since excellent photocurability is exhibited, a n-heptyl group, a n-octyl group, and a n-nonyl group are preferable, and a n-octyl group is more preferable.

For the linear or branched alkenyl group, $R_3$ in the bismaleimide compound (A) can be referred to. Among the In the formula (17), $R^b$ represents a linear or branched alkyl group having 1 to 16 carbon atoms, or a linear or branched alkenyl group having 2 to 16 carbon atoms. $R^b$ is preferably a linear or branched alkyl group, and more preferably a linear alkyl group because excellent photocurability is exhibited.

The number of carbon atoms in the alkyl group is preferably 4 to 12 because excellent photocurability is exhibited.

The number of carbon atoms in the alkenyl group is preferably 4 to 12 because excellent photocurability is exhibited.

As specific examples of the alkyl group, the alkyl groups in $R^a$ can be referred to. Among the above, since excellent photocurability is exhibited, a n-heptyl group, a n-octyl group, and a n-nonyl group are preferable, and a n-octyl group is more preferable.

As specific examples of the alkenyl group, the alkenyl groups in $R^a$ can be referred to. Among the above, since excellent photocurability is exhibited, a 2-heptenyl group, a 2-octenyl group, and a 2-nonenyl group are preferable, and a 2-octenyl group is more preferable.

In the formula (17), the value of $n_a$ is 1 or more, preferably 2 to 16, and from the viewpoint of exhibiting excellent photocurability, more preferably 3 to 14.

In the formula (17), the value of $n_b$ is 1 or more, preferably 2 to 16, and from the viewpoint of exhibiting excellent photocurability, more preferably 3 to 14.

The values of $n_a$ and $n_b$ may be the same, or may be different.

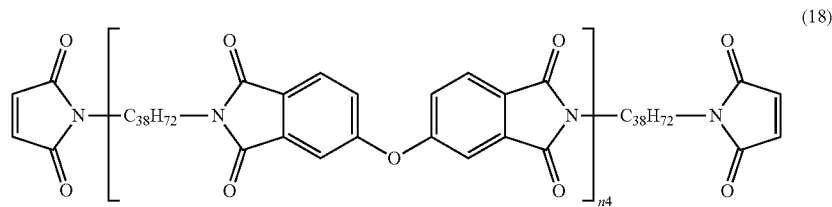
(18)
In the formula (18), $n_4$ (average) is 0.5 or more, preferably 0.8 to 10, and from the viewpoint of exhibiting excellent photocurability, more preferably 1 to 8.
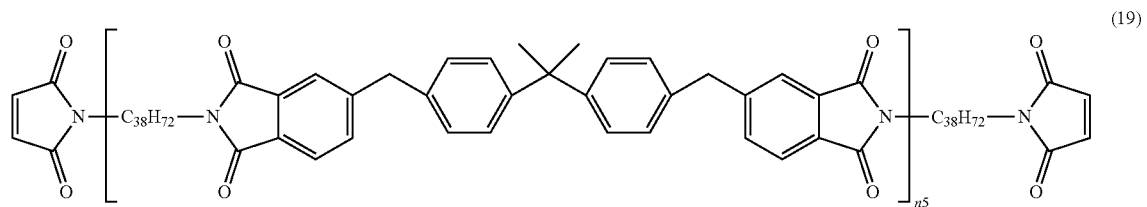
(19)
In the formula (19), $n_5$ represents an integer of 1 or more and preferably represents an integer of 1 to 10.
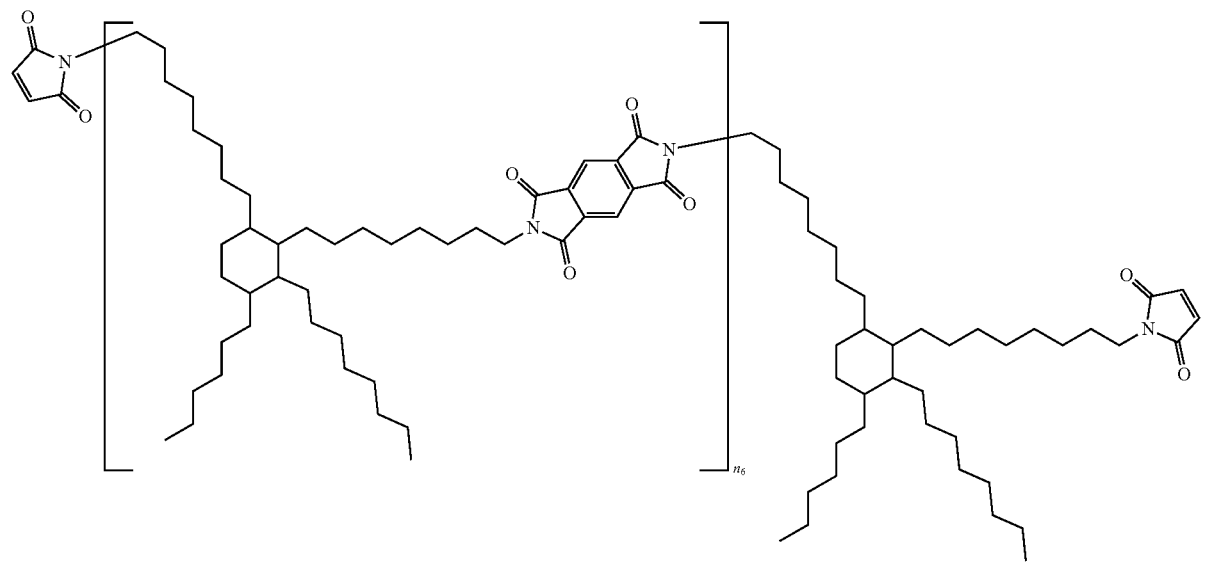
(20)
In the formula (20), $n_6$ represents an integer of 1 or more and preferably represents an integer of 1 to 10.
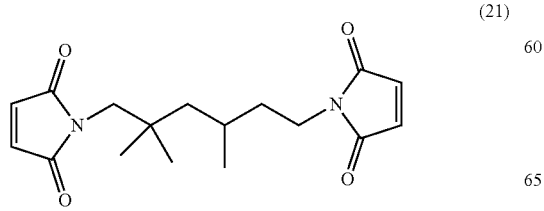
(21)

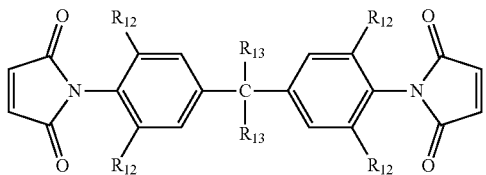

(22)

(In the above formula (22), wherein each $R_{12}$ independently represents a hydrogen atom, a methyl group or an ethyl group, and each $R_{13}$ independently represents a hydrogen atom or a methyl group.)

As the maleimide compound (D), commercial products can also be used.

Examples of the maleimide compound represented by the formula (15) include, for example, BMI-1000P (product name, $n_3$=13.6 (average) in the formula (15)) manufactured by K•I Chemical Industry Co., LTD., BMI-650P (product name, $n_3$=8.8 (average) in the formula (15)) manufactured by K•I Chemical Industry Co., LTD., BMI-250P (product name, $n_3$=3 to 8 (average) in the formula (15)) manufactured by K•I Chemical Industry Co., LTD., and CUA-4 (product name, $n_3$=1 in the formula (15)) manufactured by K•I Chemical Industry Co., LTD.

Examples of the maleimide compound represented by the formula (16) include, for example, BMI-6100 (product name, x=18 and y=18 in the formula (16)) manufactured by Designer Molecules Inc.

Examples of the maleimide compound represented by the formula (17) include, for example, BMI-689 (product name, the formula (23), functional group equivalent: 346 g/eq.) manufactured by Designer Molecules Inc.

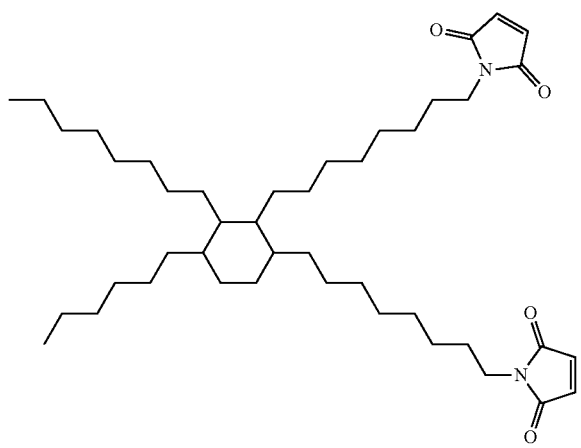

(23)

Examples of the maleimide compound represented by the formula (18) include, for example, BMI-1500 (product name, $n_4$=1.3 in the formula (18), functional group equivalent: 754 g/eq.) manufactured by Designer Molecules Inc.

As the maleimide compound represented by the formula (19), commercial products can also be used, and examples thereof include BMI-1700 (product name) manufactured by Designer Molecules Inc (DMI).

As the maleimide compound represented by the formula (20), commercial products can also be used, and examples thereof include BMI-3000 (product name) manufactured by Designer Molecules Inc. (DMI), BMI-3000J (product name) manufactured by Designer Molecules Inc. (DMI), BMI-5000 (product name) manufactured by Designer Molecules Inc. (DMI), and BMI-9000 (product name) manufactured by Designer Molecules Inc (DMI).

As the maleimide compound represented by the formula (21), commercial products can also be used, and examples thereof include BMI-TMH manufactured by Daiwakasei Industry Co., LTD.

As the maleimide compound represented by the formula (22), commercial products can also be used, and examples thereof include BMI-70 (product name) manufactured by K•I Chemical Industry Co., LTD.

One of these maleimide compounds (D) can be used, or two or more thereof can be appropriately mixed and used.

In the resin composition of the present embodiment, the content of the maleimide compound (D) is preferably 1 to 70 parts by mass, more preferably 3 to 60 parts by mass, and still more preferably 5 to 50 parts by mass based on 100 parts by mass of the total of the bismaleimide compound (A), the compound (B) and the photo initiator (C), from the viewpoint that it becomes possible to obtain a cured product mainly composed of the maleimide compounds and photocurability is further improved.

In the resin composition of the present embodiment, the compounding ratio between the bismaleimide compound (A) and the maleimide compound (D) ((A):(D)) is preferably 1 to 99:99 to 1, more preferably 5 to 95:95 to 5, and still more preferably 10 to 90:90 to 10 on a mass basis from the viewpoint that it becomes possible to obtain a cured product mainly composed of the maleimide compounds and photocurability is further improved.

In the resin composition of the present embodiment, the total content of the bismaleimide compound (A) and the maleimide compound (D) is preferably 40 to 99 parts by mass, more preferably 50 to 97 parts by mass, and still more preferably 60 to 96 parts by mass based on 100 parts by mass of the total of the bismaleimide compound (A), the compound (B), the photo initiator (C) and the maleimide compound (D), from the viewpoint that it becomes possible to obtain a cured product mainly composed of the maleimide compounds and photocurability is further improved.

[Filler (E)]

In the resin composition of the present embodiment, a filler (E) (also referred to as component (E)) can be contained for improving a variety of characteristics such as a coating property and heat resistance. The filler (E) is preferably one that has an insulation property and does not inhibit transmittivity for various active energy rays used for photocuring, and more preferably one that does not inhibit transmittivity for active energy rays including a wavelength of 365 nm (i-line) and/or a wavelength of 405 nm (h-line).

Examples of the filler (E) include, for example, silica (for example, natural silica, fused silica, amorphous silica and hollow silica), an aluminum compound (for example, boehmite, aluminum hydroxide, alumina and aluminum nitride), a boron compound (for example, boron nitride), a magnesium compound (for example, magnesium oxide and magnesium hydroxide), a calcium compound (for example, calcium carbonate), a molybdenum compound (for example, molybdenum oxide and zinc molybdate), a barium compound (for example, barium sulfate and barium silicate), talc (for example, natural talc and calcined talc), mica, glass (for example, short fibrous glass, spherical glass, fine powder glass, E glass, T glass and D glass), silicone powder, a fluororesin-based filler, a urethane resin-based filler, a (meth)acrylic resin-based filler, a polyethylene-based filler, a styrene-butadiene rubber, and a silicone rubber. One of these fillers (E) can be used, or two or more thereof can be appropriately mixed and used.

Among the above, silica, boehmite, barium sulfate, silicone powder, a fluororesin-based filler, a urethane resin-based filler, a (meth)acrylic resin-based filler, a polyethylene-based filler, a styrene-butadiene rubber and a silicone rubber are preferable.

These fillers (E) may be surface-treated with a silane coupling agent, which will be mentioned later, or the like.

From the viewpoint of improving the heat resistance of the cured product and also obtaining a good coating property, silica is preferable and fused silica is more preferable. Specific examples of the silica include SFP-130MC (product name) manufactured by Denka Company Limited, and SC2050-MB (product name), SC1050-MLE (product name), YA010C-MFN (product name), and YA050C-MJA (product name) manufactured by Admatechs Company Limited.

The particle diameter of the filler (E), and is normally 0.005 to 10 µm, and is preferably 0.01 to 1.0 µm from the viewpoint of ultraviolet light transmittivity of the resin composition.

In the resin composition of the present embodiment, the content of the filler (E) is preferably 300 parts by mass or less, more preferably 200 parts by mass or less, and still more preferably 100 parts by mass or less based on 100 parts by mass of the total of the bismaleimide compound (A), the compound (B) and the photo initiator (C) from the viewpoint of improving the light transmittivity of the resin composition and the heat resistance of the cured product. The upper limit value may be 30 parts by mass or less, 20 parts by mass or less, or 10 parts by mass or less. When the filler (E) is contained, the lower limit value of its content is normally 1 part by mass based on 100 parts by mass of the total of the bismaleimide compound (A), the compound (B) and the photo initiator (C) from the viewpoint of obtaining effects of improving a variety of characteristics such as a coating property and heat resistance.

[Silane Coupling Agent and Wetting and Dispersing Agent]

In the resin composition in the present embodiment, a silane coupling agent and/or a wetting and dispersing agent can also be used in combination in order to improve the dispersibility of the filler, and the adhesive strength between the polymers and/or the resins and the filler.

The silane coupling agent is not particularly limited as long as it is a silane coupling agent generally used for surface treatment of inorganic matters. Specific examples include aminosilane-based compounds such as 3-aminopropyltrimethoxysilane, γ-aminopropyltriethoxysilane, 3-aminopropyldimethoxysilane, 3-aminopropyldiethoxydiethoxysilane, N-β-(aminoethyl)-γ-aminopropyltrimethoxysilane, N-(2-aminoethyl)-3-aminopropyltriethoxysilane, N-(2-aminoethyl)-3-aminopropyldimethoxymethylsilane, N-(2-aminoethyl)-3-aminopropyldiethoxymethylsilane, N-phenyl-3-aminopropyltrimethoxysilane, N-phenyl-3-aminopropyltriethoxysilane, [3-(6-aminohexylamino)propyl]trimethoxysilane and [3-(N,N-dimethylamino)propyl]trimethoxysilane; epoxysilane-based compounds such as γ-glycidoxypropyltrimethoxysilane, 3-glycidoxypropyltriethoxysilane, 3-glycidoxypropyldimethoxysilane, 3-glycidoxypropyldiethoxysilane, 2-(3,4-epoxycyclohexyl)ethyltrimethoxysilane and [8-(glycidyloxy)-n-octyl]trimethoxysilane; vinylsilane-based compounds such as vinyltris(2-methoxyethoxy)silane, vinyltrimethoxysilane, vinyltriethoxysilane, dimethoxymethylvinylsilane, diethoxymethylvinylsilane, trimethoxy(7-octen-1-yl)silane and trimethoxy(4-vinylphenyl)silane; methacrylic silane-based compounds such as 3-methacryloxypropyltrimethoxysilane, 3-methacryloxypropyltriethoxysilane, 3-methacryloxypropyldimethoxymethylsilane and 3-methacryloxypropyldimethoxymethylsilane; acrylic silane-based compounds such as γ-acryloxypropyltrimethoxysilane and 3-acryloxypropyltriethoxysilane; isocyanate silane-based compounds such as 3-isocyanatepropyltrimethoxysilane and 3-isocyanatepropyltriethoxysilane; isocyanurate silane-based compounds such as tris-(trimethoxysilylpropyl)isocyanurate; mercaptosilane-based compounds such as 3-mercaptopropyltrimethoxysilane and 3-mercaptopropyldimethoxymethylsilane; ureidosilane-based compounds such as 3-ureidopropyltriethoxysilane; styrylsilane-based compounds such as p-styryltrimethoxysilane; cationic silane-based compounds such as N-β-(N-vinylbenzylaminoethyl)-γ-aminopropyltrimethoxysilane hydrochlorides; acid anhydride-based compounds such as [3-(trimethoxysilyl)propyl]succinic anhydride; phenylsilane-based compounds such as phenyltrimethoxysilane, phenyltriethoxysilane, dimethoxymethylphenylsilane, diethoxymethylphenylsilane and p-tolyltrimethoxysilane; and arylsilane-based compounds such as trimethoxy(1-naphthyl)silane. One of these silane coupling agents can be used, or two or more thereof can be appropriately mixed and used.

In the resin composition of the present embodiment, the content of the silane coupling agent is normally 0.1 to 10 parts by mass based on 100 parts by mass of the total of the bismaleimide compound (A), the compound (B) and the photo initiator (C).

The wetting and dispersing agent is not particularly limited as long as it is a dispersion stabilizer used for a paint. Specific examples of the wetting and dispersing agent include a wetting and dispersing agent such as DISPERBYK (registered trademark)-110 (product name), 111 (product name), 118 (product name), 180 (product name), and 161 (product name), BYK (registered trademark)-W996 (product name), W9010 (product name), and W903 (product name) manufactured by BYK Japan KK. One of these wetting and dispersing agents can be used, or two or more thereof can be appropriately mixed and used.

In the resin composition of the present embodiment, the content of the wetting and dispersing agent is normally 0.1 to 10 parts by mass based on 100 parts by mass of the total of the bismaleimide compound (A), the compound (B) and the photo initiator (C).

[Cyanate Compound, Phenolic Resin, Oxetane Resin, Benzoxazine Compound, Epoxy Resin, and Additional Compound]

In the present embodiment, as long as the effect of the present invention is achieved, the resin composition of the present embodiment may contain a variety of types of compounds and resins such as a cyanate compound, a phenolic resin, an oxetane resin, a benzoxazine compound, epoxy resin and additional compounds in addition to the bismaleimide compound (A), the compound containing one or more carboxy groups, the photo initiator (C) and the maleimide compound (D) according to the present embodiment, depending on properties such as flame retardancy, heat resistance and a thermal expansion property of the cured product. Preferably, these compounds and resins ensure that the resin composition of the present embodiment becomes light-sensitive to be photocured when exposed with an active energy ray including a wavelength of 365 nm (i-line) and/or an active energy ray including a wavelength of 405 nm (h-line).

One of these compounds and resins can be used, or two or more thereof can be appropriately mixed and used.

(Cyanate Compound)

The cyanate compound is not particularly limited as long as it is a resin having in the molecule an aromatic moiety substituted by at least one cyanate group (cyanate group).

For example, mention may be made of those represented by the formula (24).

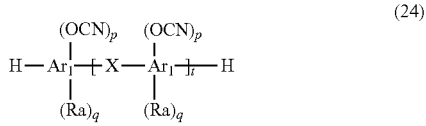

(24)

In the formula (24), $Ar_1$ represents a benzene ring, a naphthalene ring, or two benzene rings bonded to each other by a single bond. When there are a plurality of $Ar_1$, $Ar_1$ may be the same as or different from each other. Each Ra independently represents a hydrogen atom, an alkyl group having 1 to 6 carbon atoms, an alkenyl group having 2 to 6 carbon atoms, an aryl group having 6 to 12 carbon atoms, an alkoxyl group having 1 to 4 carbon atoms, or a group in which an alkyl group having 1 to 6 carbon atoms and an aryl group having 6 to 12 carbon atoms are bonded to each other. The aromatic ring for Ra may have a substituent, and any position can be selected for the substituents in $Ar_1$ and Ra. p represents the number of cyanate groups bonded to $Ar_1$ and is each independently an integer of 1 to 3. q represents the number of Ra bonded to $Ar_1$ and is 4-p when $Ar_1$ is a benzene ring, 6-p when $Ar_1$ is a naphthalene ring, and 8-p when $Ar_1$ is two benzene rings bonded to each other by a single bond. t represents the average number of repetitions and is an integer of 0 to 50, and the cyanate compound may be a mixture of compounds having different t. X represents any of a single bond, a divalent organic group having 1 to 50 carbon atoms (a hydrogen atom may be replaced by a heteroatom), a divalent organic group having 1 to 10 nitrogen atoms (for example, —N—R—N— (wherein R represents an organic group)), a carbonyl group (—CO—), a carboxy group (—C(=O)O—), a carbonyl dioxide group (—OC(=O)O—), a sulfonyl group (—SO$_2$—), a divalent sulfur atom, and a divalent oxygen atom, and X is each independently as defined above when there are a plurality of X.

The alkyl group for Ra in the formula (24) may have either a linear or branched chain structure or a cyclic structure (for example, a cycloalkyl group).

In addition, a hydrogen atom in the alkyl group and the aryl group for Ra in the formula (24) may be replaced by a halogen atom such as a fluorine atom or a chlorine atom; an alkoxyl group such as a methoxy group or a phenoxy group; a cyano group, or the like.

Specific examples of the alkyl group include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Specific examples of the alkenyl group include a vinyl group, a (meth)allyl group, an isopropenyl group, a 1-propenyl group, a 2-butenyl group, a 3-butenyl group, a 1,3-butanedienyl group, a 2-methyl-2-propenyl group, a 2-pentenyl group, and a 2-hexenyl group.

Specific examples of the aryl group include a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group. Furthermore, examples of the alkoxyl group include a methoxy group, an ethoxy group, a propoxy group, an isopropoxy group, a n-butoxy group, an isobutoxy group, and a tert-butoxy group.

Specific examples of the divalent organic group having 1 to 50 carbon atoms for X in the formula (24) include a methylene group, an ethylene group, a trimethylene group, a cyclopentylene group, a cyclohexylene group, a trimethylcyclohexylene group, a biphenylylmethylene group, a dimethylmethylene-phenylene-dimethylmethylene group, a fluorenediyl group, and a phthalidediyl group. A hydrogen atom in the divalent organic group may be replaced by a halogen atom such as a fluorine atom or a chlorine atom; an alkoxyl group such as a methoxy group or a phenoxy group; a cyano group, or the like.

Examples of the divalent organic group having 1 to 10 nitrogen atoms for X in the formula (24) include an imino group and a polyimide group.

In addition, examples of the organic group of X in the formula (24) include one having a structure represented by the formula (25) or the formula (26).

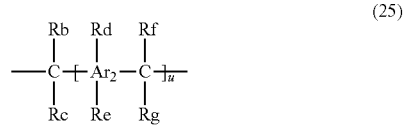

(25)

In the formula (25), $Ar_2$ represents a benzenediyl group, a naphthalenediyl group, or a biphenyldiyl group, and may be the same as or different from each other when u is an integer of 2 or more. Rb, Rc, Rf, and Rg each independently represent a hydrogen atom, an alkyl group having 1 to 6 carbon atoms, an aryl group having 6 to 12 carbon atoms, a trifluoromethyl group, or an aryl group having at least one phenolic hydroxy group. Rd and Re are each independently selected from any one of a hydrogen atom, an alkyl group having 1 to 6 carbon atoms, an aryl group having 6 to 12 carbon atoms, an alkoxyl group having 1 to 4 carbon atoms, and a hydroxy group. u represents an integer of 0 to 5.

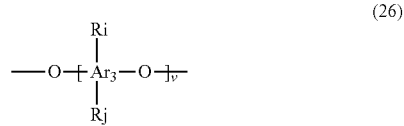

(26)

In the formula (26), $Ar_a$ represents a benzenediyl group, a naphthalenediyl group, or a biphenyldiyl group, and may be the same as or different from each other when v is an integer of 2 or more. Ri and Rj each independently represent a hydrogen atom, an alkyl group having 1 to 6 carbon atoms, an aryl group having 6 to 12 carbon atoms, a benzyl group, an alkoxyl group having 1 to 4 carbon atoms, a hydroxy group, a trifluoromethyl group, or an aryl group substituted by at least one cyanate group. v represents an integer of 0 to 5, and the cyanate compound may be a mixture of compounds having different v.

Furthermore, examples of X in the formula (24) include divalent groups represented by the formulas.

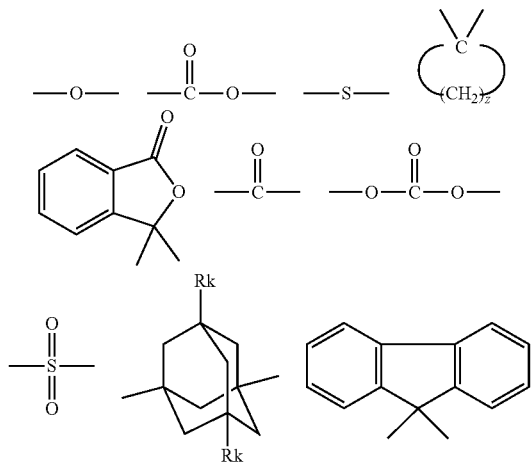

Here, in the above formula, z represents an integer of 4 to 7. Each Rk independently represents a hydrogen atom or an alkyl group having 1 to 6 carbon atoms.

Specific examples of $Ar_2$ in the formula (25) and $Ar_a$ in the formula (26) include a benzeneziyl group to which two carbon atoms shown in the formula (25) or two oxygen atoms shown in the formula (26) are bonded at positions 1 and 4 or positions 1 and 3, a biphenyldiyl group to which the above two carbon atoms or two oxygen atoms are bonded at positions 4 and 4', positions 2 and 4', positions 2 and 2', positions 2 and 3', positions 3 and 3', or positions 3 and 4', and a naphthalenediyl group to which the above two carbon atoms or two oxygen atoms are bonded at positions 2 and 6, positions 1 and 5, positions 1 and 6, positions 1 and 8, positions 1 and 3, positions 1 and 4, or positions 2 and 7.

The alkyl group and the aryl group for Rb, Rc, Rd, Re, Rf, and Rg in the formula (25) and Ri and Rj in the formula (26) have the same meanings as those in the above formula (24).

Specific examples of the cyanato-substituted aromatic compound represented by the above formula (24) include cyanatobenzene, 1-cyanato-2-, 1-cyanato-3-, or 1-cyanato-4-methylbenzene, 1-cyanato-2-, 1-cyanato-3-, or 1-cyanato-4-methoxybenzene, 1-cyanato-2,3-, 1-cyanato-2,4-, 1-cyanato-2,5-, 1-cyanato-2,6-, 1-cyanato-3,4-, or 1-cyanato-3,5-dimethylbenzene, cyanatoethylbenzene, cyanatobutylbenzene, cyanatooctylbenzene, cyanatononylbenzene, 2-(4-cyanaphenyl)-2-phenylpropane (a cyanate of 4-α-cumylphenol), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (a cyanate of eugenol), methyl(4-cyanatophenyl)sulfide, 1-cyanato-3-trifluoromethylbenzene, 4-cyanatobiphenyl, 1-cyanato-2- or 1-cyanato-4-acetylbenzene, 4-cyanatobenzaldehyde, methyl 4-cyanatobenzoate ester, phenyl 4-cyanatobenzoate ester, 1-cyanato-4-acetaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-dimethylbenzene, 1,3-dicyanato-2,4,6-trimethylbenzene, 1,3-dicyanato-5-methylbenzene, 1-cyanato- or 2-cyanatonaphthalene, 1-cyanato4-methoxynaphthalene, 2-cyanato-6-methylnaphthalene, 2-cyanato-7-methoxynaphthalene, 2,2'-dicyanato-1,1'-binaphthyl, 1,3-, 1,4-, 1,5-, 1,6-, 1,7-, 2,3-, 2,6-, or 2,7-dicyanatonaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl) methane, 1,1-bis(4-cyanatophenyl)ethane, 1,1-bis(4-cyanatophenyl)propane, 2,2-bis(4-cyanatophenyl)propane, 2,2-bis(4-cyanato-3-methylphenyl)propane, 2,2-bis(2-cyanato-5-biphenylyl)propane, 2,2-bis(4-cyanatophenyl) hexafluoropropane, 2,2-bis(4-cyanato-3,5-dimethylphenyl) propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis(4-cyanatophenyl)pentane, 2,2-bis(4-cyanatophenyl) hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl) diphenylmethane, bis(4-cyanatophenyl)-2,2-dichloroethylene, 1,3-bis[2-(4-cyanatophenyl)-2-propyl] benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis (4-cyanatophenyl) ether, bis(4-cyanatophenyl) sulfide, bis (4-cyanatophenyl) sulfone, 4-cyanatobenzoic acid-4-cyanatophenyl ester (4-cyanatophenyl-4-cyanatobenzoate), bis-(4-cyanatophenyl) carbonate, 1,3-bis(4-cyanatophenyl) adamantane, 1,3-bis(4-cyanatophenyl)-5,7-dimethyladamantane, 3,3-bis(4-cyanatophenyl)isobenzofuran-1(3H)-one (a cyanate of phenolphthalein), 3,3-bis(4-cyanato-3-methylphenyl)isobenzofuran-1(3H)-one (a cyanate of o-cresolphthalein), 9,9'-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl) propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4,4'-oxydiphthalimide, bis(N-4-cyanatophenyl)-4,4'-oxydiphthalimide, bis(N-4-cyanato-2-methylphenyl)-4,4'-(hexafluoroisopropylidene) diphthalimide, tris(3,5-dimethyl-4-cyanatobenzyl) isocyanurate, 2-phenyl-3,3-bis(4-cyanatophenyl)phthalimidine, 2-(4-methylphenyl)-3,3-bis(4-cyanatophenyl)phthalimidine, 2-phenyl-3,3-bis(4-cyanato-3-methylphenyl)

phthalimidine, 1-methyl-3,3-bis(4-cyanatophenyl)indolin-2-one, and 2-phenyl-3,3-bis(4-cyanatophenyl)indolin-2-one.

One of these cyanate compounds can be used, or two or more thereof can be appropriately mixed and used.

Other specific examples of the cyanate compound represented by the formula (24) include those obtained by cyanation of a phenolic resin such as a phenol novolac resin and a cresol novolac resin (those obtained by reacting phenol, an alkyl-substituted phenol or a halogen-substituted phenol with a formaldehyde compound such as formalin or paraformaldehyde in an acidic solution, using a publicly known method), a trisphenol novolac resin (those obtained by reacting hydroxybenzaldehyde with phenol in the presence of an acidic catalyst), a fluorene novolac resin (those obtained by reacting a fluorenone compound with a 9,9-bis(hydroxyaryl)fluorene in the presence of an acidic catalyst), a phenol aralkyl resin, a cresol aralkyl resin, a naphthol aralkyl resin, and a biphenyl aralkyl resin (those obtained by reacting a bishalogenomethyl compound as represented by $Ar_4$—$(CH_2Y)_2$ (wherein $Ar_4$ represents a phenyl group and Y represents a halogen atom. The same applies in this paragraph.) with a phenolic compound with an acidic catalyst or with no catalyst, those obtained by reacting a bis(alkoxymethyl) compound as represented by $Ar_4$—$(CH_2OR)_2$ (wherein R represents an alkyl group) with a phenolic compound in the presence of an acidic catalyst, or those obtained by reacting a bis(hydroxymethyl) compound as represented by $Ar_4$—$(CH_2OH)_2$ with a phenolic compound in the presence of an acidic catalyst, or those obtained by polycondensing an aromatic aldehyde compound, an aralkyl compound, and a phenolic compound, using a publicly known method), a phenol-modified xylene formaldehyde resin (those obtained by reacting a xylene formaldehyde resin with a phenolic compound in the presence of an acidic catalyst, using a publicly known method), a modified naphthalene formaldehyde resin (those obtained by reacting a naphthalene formaldehyde resin with a hydroxy-substituted aromatic compound in the presence of an acidic catalyst, using a publicly known method), a phenol-modified dicyclopentadiene resin, and a phenolic resin having a polynaphthylene ether structure (those obtained by subjecting a polyvalent hydroxynaphthalene compound having two or more phenolic hydroxy groups in one molecule to dehydration condensation in the presence of a basic catalyst, using a publicly known method) by a method similar to the above, and a prepolymer thereof. One of these cyanate compounds can be used, or two or more thereof can be appropriately mixed and used.

The method for producing these cyanate compounds is not particularly limited, and a publicly known method can be used. Examples of such a production method include acquisition or synthesis of a hydroxy group containing compound having a desired skeleton and cyanation of that compound by modifying the hydroxy group by a publicly known method. Examples of the approach for the cyanation of hydroxy groups include, for example, the approach described in Ian Hamerton, Chemistry and Technology of Cyanate Ester Resins, Blackie Academic & Professional.

The cured product using these cyanate compounds has a property of being excellent in glass transition temperature, a low thermal expansion property, plating adhesiveness, and the like.

In the resin composition of the present embodiment, the content of the cyanate compound is normally 0.01 to 40 parts by mass based on 100 parts by mass of the total of the bismaleimide compound (A), the compound (B) and the photo initiator (C).

(Phenolic Resin)

As the phenolic resin, those publicly known in general can be used as long as they are phenolic resins having two or more hydroxyl groups in one molecule. Examples thereof include a bisphenol A-based phenolic resin, a bisphenol E-based phenolic resin, a bisphenol F-based phenolic resin, a bisphenol S-based phenolic resin, a phenol novolac resin, a bisphenol A novolac-based phenolic resin, a glycidyl ester-based phenolic resin, an aralkyl novolac-based phenolic resin, a biphenyl aralkyl-based phenolic resin, a cresol novolac-based phenolic resin, a polyfunctional phenolic resin, a naphthol resin, a naphthol novolac resin, a polyfunctional naphthol resin, an anthracene-based phenolic resin, a naphthalene skeleton modified novolac-based phenolic resin, a phenol aralkyl-based phenolic resin, a naphthol aralkyl-based phenolic resin, a dicyclopentadiene-based phenolic resin, a biphenyl-based phenolic resin, an alicyclic phenolic resin, a polyol-based phenolic resin, a phosphorus containing phenolic resin, a polymerizable unsaturated hydrocarbon group containing phenolic resin, and a hydroxyl group containing silicone resin. One of these phenol resins can be used, or two or more thereof can be appropriately mixed and used.

In the resin composition of the present embodiment, the content of the phenol resin is normally 0.01 to 40 parts by mass based on 100 parts by mass of the total of the bismaleimide compound (A), the compound (B) and the photo initiator (C).

(Oxetane Resin)

As the oxetane resin, those publicly known in general can be used. Examples thereof include, for example, oxetane, an alkyloxetane such as 2-methyloxetane, 2,2-dimethyloxetane, 3-methyloxetane, and 3,3-dimethyloxetane, 3-methyl-3-methoxymethyloxetane, 3,3-di(trifluoromethyl)perfluoxetane, 2-chloromethyloxetane, 3,3-bis(chloromethyl)oxetane, biphenyl-based oxetane, OXT-101 (manufactured by Toagosei Co., Ltd., product name), OXT-121 (manufactured by Toagosei Co., Ltd., product name), and OXT-221 (manufactured by Toagosei Co., Ltd., product name). One of these oxetane resins can be used, or two or more thereof can be appropriately mixed and used.

In the resin composition of the present embodiment, the content of the oxetane resin is normally 0.01 to 40 parts by mass based on 100 parts by mass of the total of the bismaleimide compound (A), the compound (B) and the photo initiator (C).

(Benzoxazine Compound)

As the benzoxazine compound, those publicly known in general can be used as long as they are compounds having two or more dihydrobenzoxazine rings in one molecule. Examples thereof include a bisphenol A-based benzoxazine BA-BXZ (manufactured by Konishi Chemical Ind. Co., Ltd., product name), a bisphenol F-based benzoxazine BF—BXZ (manufactured by Konishi Chemical Ind. Co., Ltd., product name), a bisphenol S-based benzoxazine BS—BXZ (manufactured by Konishi Chemical Ind. Co., Ltd., product name), and a phenolphthalein-based benzoxazine. One of these benzoxazine compounds can be used, or two or more thereof can be appropriately mixed and used.

In the resin composition of the present embodiment, the content of the benzoxazine compound is normally 0.01 to 40 parts by mass based on 100 parts by mass of the total of the bismaleimide compound (A), the compound (B) and the photo initiator (C).

(Epoxy Resin)

There is no particular limitation on the epoxy resin, and those publicly known in general can be used. Examples thereof include, for example, a bisphenol A-based epoxy resin, a bisphenol E-based epoxy resin, a bisphenol F-based epoxy resin, a bisphenol S-based epoxy resin, a bisphenol A novolac-based epoxy resin, a biphenyl-based epoxy resin, a phenol novolac-based epoxy resin, a cresol novolac-based epoxy resin, a xylene novolac-based epoxy resin, a polyfunctional phenol-based epoxy resin, a naphthalene-based epoxy resin, a naphthalene skeleton modified novolac-based epoxy resin, a naphthylene ether-based epoxy resin, a phenol aralkyl-based epoxy resin, an anthracene-based epoxy resin, a trifunctional phenol-based epoxy resin, a tetrafunctional phenol-based epoxy resin, triglycidyl isocyanurate, a glycidyl ester-based epoxy resin, an alicyclic epoxy resin, a dicyclopentadiene novolac-based epoxy resin, a biphenyl novolac-based epoxy resin, a phenol aralkyl novolac-based epoxy resin, a naphthol aralkyl novolac-based epoxy resin, an aralkyl novolac-based epoxy resin, a naphthol aralkyl-based epoxy resin, a dicyclopentadiene-based epoxy resin, a polyol-based epoxy resin, a phosphorus containing epoxy resin, a glycidyl amine, a compound obtained by epoxidizing a double bond of butadiene and the like, a compound obtained by the reaction between a hydroxyl group containing silicone resin and epichlorohydrin, and a halide thereof. One of these epoxy resins can be used, or two or more thereof can be appropriately mixed and used.

As the epoxy resin, commercial products can also be used. Examples of the commercial products include an epoxy resin represented by the formula (27) (NC-3000 FH (product name) manufactured by Nippon Kayaku Co., Ltd., $n_7$ is about 4 in the formula (27)), and a naphthalene-based epoxy resin represented by the formula (28) (HP-4710 (product name) manufactured by DIC CORPORATION).

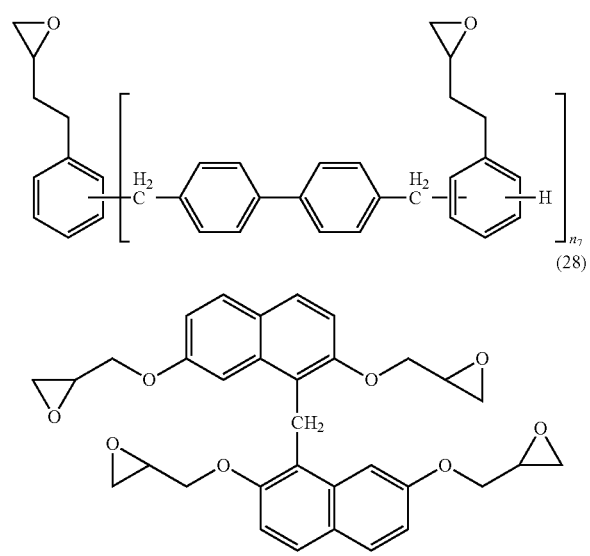

One of these epoxy resins can be used, or two or more thereof can be appropriately mixed and used.

In the resin composition of the present embodiment, the content of the epoxy resin is normally 0.01 to 40 parts by mass based on 100 parts by mass of the total of the bismaleimide compound (A), the compound (B) and the photo initiator (C).

(Additional Compound)

Examples of the additional compounds include a vinyl ether such as ethyl vinyl ether, propyl vinyl ether, hydroxyethyl vinyl ether, and ethylene glycol divinyl ether; a styrene such as styrene, methylstyrene, ethylstyrene, and divinylbenzene; triallyl isocyanurate, trimethallyl isocyanurate, and bisallylnadic imide. One of these compounds can be used, or two or more thereof can be appropriately mixed and used.

In the resin composition of the present embodiment, the content of the additional compound is normally 0.01 to 40 parts by mass based on 100 parts by mass of the total of the bismaleimide compound (A), the compound (B) and the photo initiator (C).

[Organic Solvent]

The resin composition of the present embodiment may contain an organic solvent if required. When an organic solvent is used, the viscosity can be adjusted during the preparation of the resin composition. The type of the organic solvent is not particularly limited as long as it is capable of dissolving a part of or all of the resin in the resin composition. Examples of the organic solvent include ketones such as acetone, methyl ethyl ketone, and methyl isobutyl ketone; alicyclic ketones such as cyclopentanone, and cyclohexanone; cellosolve-based solvents such as propylene glycol monomethyl ether and propylene glycol monomethyl ether acetate; ester-based solvents such as ethyl lactate, methyl acetate, ethyl acetate, butyl acetate, isoamyl acetate, ethyl lactate, methyl methoxypropionate, methyl hydroxyisobutyrate, and γ-butyrolactone; polar solvents such as amides such as dimethylacetamide and dimethylformamide; and nonpolar solvents such as aromatic hydrocarbons such as toluene and xylene.

One of these organic solvents can be used, or two or more thereof can be appropriately mixed and used.

[Additional Component]

In the resin composition of the present embodiment, a variety of polymer compounds such as thermosetting resins, thermoplastic resins and oligomers thereof, and elastomers, which have not been mentioned before; flame retardant compounds, which have not been mentioned before; additive agents and the like can also be used in combination to the extent that the characteristics of the present embodiment are not impaired. These are not particularly limited as long as they are those generally used. Examples of the flame retardant compound include, for example, a nitrogen containing compound such as melamine and benzoguanamine, an oxazine ring containing compound, and a phosphorus compound such as a phosphate compound, an aromatic fused phosphate ester, and a halogen containing fused phosphate ester. Examples of the additive agent include, for example, an ultraviolet absorbing agent, an antioxidant, a fluorescent brightening agent, a photosensitizer, a dye, a pigment, a thickening agent, a lubricant, a defoaming agent, a surface conditioner, a brightening agent, a polymerization inhibitor and a thermal curing promoting agent. One of these components can be used, or two or more thereof can be appropriately mixed and used.

In the resin composition of the present embodiment, the content of the additional component is normally 0.1 to 10 parts by mass based on 100 parts by mass of the total of the bismaleimide compound (A), the compound (B) and the photo initiator (C).

[Method for Producing Resin Composition]

The resin composition of the present embodiment is prepared by appropriately mixing the bismaleimide compound (A), the compound (B) and the photo initiator (C), and if required, the maleimide compound (D) other than the bismaleimide compound (A), the filler (E), the additional resin, the additional compound, the additive agent, and the like. The resin composition can be suitably used as a varnish upon fabricating a resin sheet of the present embodiment, which will be mentioned later. The organic solvent used for preparation of varnish is not particularly limited, and specific examples thereof are as described above.

Examples of the method for producing the resin composition include a method in which each of the components described above is sequentially compounded in a solvent and stirred sufficiently. The resin composition has excellent alkaline developability together with excellent photocurability and good solubility in an organic solvent.

Upon producing the resin composition, publicly known treatment (stirring, mixing, and kneading treatment and the like) for uniformly dissolving or dispersing each component can be carried out, if required. Specifically, by using a stirring tank equipped with a stirrer having an appropriate stirring capacity to carry out the stirring and dispersion treatment, the dispersibility of each component in the resin composition can be improved. The stirring, mixing and kneading treatment can be appropriately carried out by using a publicly known apparatus such as a stirring apparatus intended for dispersion such as an ultrasonic homogenizer; an apparatus intended for mixing such as a three roll mill, a ball mill, a bead mill or a sand mill; or a revolution or rotation mixing apparatus. In addition, upon preparing the resin composition, an organic solvent can be used if required. The type of the organic solvent is not particularly limited as long as it is capable of dissolving the resin in the resin composition, and specific examples thereof are as described above.

The resin composition can be suitably used as a varnish upon fabricating a resin sheet of the present embodiment, which will be mentioned later. The varnish can be obtained by a publicly known method. For example, the varnish can be obtained by adding 10 to 900 parts by mass of an organic solvent to 100 parts by mass of components other than the organic solvent in the resin composition of the present embodiment and the publicly known mixing treatment (stirring, kneading or the like).

[Application]

The resin composition can be used in applications where an insulating resin composition can be preferably used. For example, the resin composition of the present embodiment can be used for applications including a photosensitive film, a photosensitive film with a support, a prepreg, a resin sheet, a circuit substrate (applications for a laminate, applications for a multilayer printed wiring board, and the like), a solder resist, an underfill material, a die bonding material, a semiconductor sealing material, a hole filling resin, and a component embedding resin. In particular, the resin composition can be suitably used for insulation layers of multilayer printed wiring boards or solder resists because the resin composition does not inhibit a photocuring reaction and has excellent photocurability in an exposure step and is capable of imparting excellent alkaline developability in a development step.

[Cured Product]

The cured product is formed by curing the resin composition of the present embodiment. The cured product can be obtained by, for example, melting the resin composition or dissolving the resin composition in a solvent, then pouring the resin composition into a mold, and curing the resin composition with light under normal conditions. It is preferable to cure the resin composition in a light wavelength range of 100 to 500 nm where curing is efficiently promoted by a photo initiator or the like.

[Resin Sheet]

A resin sheet of the present embodiment is a resin sheet with a support containing: a support; and a resin layer disposed on one surface or both surfaces of the support, wherein the resin layer contains the resin composition of the present embodiment. The resin sheet can be produced by applying the resin composition onto the support and drying it. The resin layer in the resin sheet has excellent photocurability and alkaline developability.

As the support, those publicly known can be used, and a resin film is preferable. Examples of the resin film include a polyimide film, a polyamide film, a polyester film, a polyethylene terephthalate (PET) film, a polybutylene terephthalate (PBT) film, a polypropylene (PP) film, a polyethylene (PE) film, a polyethylene naphthalate film, a polyvinyl alcohol film and a triacetyl acetate film. Among the above, PET film is preferable.

Preferably, the surface of the resin film is coated with a release agent in order to facilitate release from the resin layer. The thickness of the resin film is preferably in the range of 5 to 100 μm and more preferably in the range of 10 to 50 μm. When the thickness is less than 5 μm, the support tends to be easily torn at the time when the support is released before alkaline development, and when the thickness is greater than 100 μm, the resolution upon being exposed through the support tends to be reduced.

In addition, in order to reduce light scattering during exposure, it is preferable that the resin film should have excellent transparency.

Furthermore, in the resin sheet in the present embodiment, the resin layer thereof may be protected with a protective film.

By protecting the resin layer side with a protective film, adhesion of dust and the like to the surface of the resin layer and scratches can be prevented. As the protective film, a film composed of a material similar to the resin film can be used. The thickness of the protective film is preferably in the range of 1 to 50 μm and more preferably in the range of 5 to 40 μm. If the thickness is less than 1 μm, the handleability of the protective film tends to be reduced, and if the thickness is greater than 50 μm, the inexpensiveness tends to be poor. Note that it is preferable for the protective film to have a smaller adhesive force between the resin layer and the protective film than the adhesive force between the resin layer and the support.

Examples of the method for producing the resin sheet in the present embodiment include a method in which the resin composition of the present embodiment is applied to a support such as PET film and the organic solvent is removed by drying to produce the resin sheet.

The application method can be carried out by a publicly known method using, for example, a roll coater, a comma coater, a gravure coater, a die coater, a bar coater, a lip coater, a knife coater, a squeeze coater, or the like. The drying can be carried out by, for example, a method of heating in a dryer at 60 to 200° C. for 1 to 60 minutes.

The amount of organic solvent remaining in the resin layer is preferably less than 5% by mass based on the total mass of the resin layer from the viewpoint of preventing diffusion of the organic solvent in the subsequent steps. It is preferable that the thickness of the resin layer should be 1 to 50 μm from the viewpoint of improving handleability.

The resin sheet can be preferably used for production of insulation layers of multilayer printed wiring boards.

[Multilayer Printed Wiring Board]

The multilayer printed wiring board in the present embodiment contains an insulation layer; and a conductor layer formed on one surface or both surfaces of the insulation layer, wherein the insulation layer contains the resin composition of the present embodiment. The insulation layer can also be obtained by, for example, laminating one or more of the resin sheets and curing them. The numbers of lamination in the insulation layer and the conductor layer is not particularly limited, and the numbers of lamination can be appropriately set according to an intended application. The order of the insulation layer and the conductor layer is not particularly limited. The conductor layer may be a metal foil used for various printed wiring board materials, and examples thereof include metal foils of copper, aluminum and the like. Examples of the copper metal foil include a rolled copper foil and an electrolytic copper foil. The thickness of the conductor layer is normally 1 to 100 μm. In particular, it can be produced by the following method.

(Lamination Step)

In a lamination step, the resin layer side of the resin sheet is laminated to one surface or both surfaces of a circuit substrate using a vacuum laminator. Examples of the circuit substrate include, for example, a glass epoxy substrate, a metal substrate, a ceramic substrate, a silicon substrate, a semiconductor sealing resin substrate, a polyester substrate, a polyimide substrate, a BT resin substrate, and a thermosetting polyphenylene ether substrate. Note that a circuit substrate refers to a substrate in which a patterned conductor layer (circuit) is formed on one surface or both surfaces of a substrate as described above. Also, in a multilayer printed wiring board formed by alternately laminating a conductor layer and an insulation layer, a substrate in which one surface or both surfaces of the outermost layer of the multilayer printed wiring board are patterned conductor layers (circuits) is also included in the circuit substrate. Note that the insulation layer laminated on the multilayer printed wiring board may be an insulation layer obtained by laminating and curing one or more resin sheets in the present embodiment, or an insulation layer obtained by laminating one or more resin sheets in the present embodiment and one or more publicly known resin sheets different from the resin sheet in the present embodiment. Note that the mode in which the resin sheets in the present embodiment and the publicly known resin sheets different from the resin sheet in the present embodiment are laminated is not particularly limited. The surface of the conductor layer may be subjected to blackening treatment and/or roughening treatment by copper etching or the like in advance. In the lamination step, when the resin sheet has a protective film, the protective film is peeled off and removed. Then, the resin sheet and the circuit substrate are preheated if required, and while pressurizing and heating the resin layer of the resin sheet, it is crimped to the circuit substrate. In the present embodiment, a method of laminating the resin layer of the resin sheet to the circuit substrate under reduced pressure using a vacuum lamination method is suitably used.

As conditions of the lamination step, for example, it is preferable to perform the lamination under reduced pressure with a crimping temperature (lamination temperature) of 50 to 140° C., crimping pressure of 1 to 15 kgf/cm$^2$, crimping time of 5 to 300 seconds, and air pressure of 20 mmHg or less. Also, the lamination step may be in a batch type or in a continuous type using a roll. The vacuum lamination method can be carried out using a commercially available vacuum laminator. Examples of the commercially available vacuum laminator include, for example, Two-Stage Build-Up Laminator (product name) manufactured by Nikko-Materials Co., Ltd.

(Exposure Step)

In the exposure step, after providing the resin layer on the circuit substrate by the lamination step, a predetermined portion of the resin layer is irradiated with an active energy ray as a light source to cure the resin layer in the irradiated part.

The irradiation may be performed through a mask pattern or may be performed by using the direct imaging method in which the irradiation is directly applied. Examples of the active energy ray include, for example, ultraviolet rays, visible rays of light, electron beam, and X-rays. The wavelength of the active energy ray is, for example, in the range of 200 to 600 nm. When an ultraviolet ray is used, the irradiation amount thereof is approximately 10 to 1000 mJ/cm$^2$. Upon producing a printed wiring board having a highly dense and highly detailed wiring formation (pattern) using the stepper exposure method, it is preferable to use, for example, an active energy ray including a wavelength of 365 nm (i-line) as an active energy ray. When an active energy ray including a wavelength of 365 nm (i-line) is used, the irradiation amount is approximately 10 to 10,000 mJ/cm$^2$. Upon producing a printed wiring board having a highly dense and highly detailed wiring formation (pattern) using the direct imaging method, it is preferable to use, for example, an active energy ray including a wavelength of 405 nm (h-line) as an active energy ray. When an active energy ray including a wavelength of 405 nm (h-line) is used, the irradiation amount is approximately 10 to 10,000 mJ/cm$^2$.

There are two exposure methods for passing through the mask pattern: the contact exposure method, in which the mask pattern is adhered to the multilayer printed wiring board, and the non-contact exposure method, in which parallel light rays are used to perform the exposure without adhering the mask pattern to the multilayer printed wiring board, but either method may be used. Also, when a support is present on the resin layer, it may be exposed from the top of the support, or it may be exposed after the support is removed.

(Alkaline Development Step)

When a support is not present on the resin layer, a portion which is not photocured directly in alkaline development (unexposed portion) is removed after the exposure step, and development is performed, whereby an insulation layer pattern can be formed.

When a support is present on the resin layer, the support is removed after the exposure step, and thereafter a portion which is not photocured in alkaline development (unexposed portion) is removed, and development is performed, whereby an insulation layer pattern can be formed.

The unexposed resin layer containing the resin composition of the present embodiment has excellent alkaline developability, so that it is possible to obtain a printed wiring board having a highly detailed pattern.

In the case of alkaline development, the developing solution is not particularly limited as long as unexposed portion is selectively eluted, and alkaline developing solutions such as an aqueous tetramethylammonium hydroxide solution, an aqueous sodium carbonate solution, an aqueous potassium carbonate solution, an aqueous sodium hydroxide solution and an aqueous potassium hydroxide solution are used. In the present embodiment, it is particularly preferable to use an aqueous tetramethylammonium hydroxide solution. One of these alkaline developing solutions can be used, or two or more thereof can be appropriately mixed and used.

As the alkaline development method, for example, a known method such as dipping, paddling, spraying, shaking immersion, blushing and scraping can be carried out. In pattern formation in the present embodiment, these development methods can be used in combination if necessary. As the development method, use of a high-pressure spray is suitable because the resolution is further improved. When the spraying method is employed, the spray pressure is preferably 0.02 to 0.5 MPa.

(Postbaking Step)

In the present embodiment, a postbaking step is carried out after the alkaline development step, thereby forming an insulation layer (cured product). Examples of the postbaking step include an ultraviolet irradiation step with a high pressure mercury lamp and a heating step using a clean oven, and these steps may be used in combination as well. When irradiating with ultraviolet ray, the irradiation amount thereof can be adjusted if required, and for example, the irradiation can be carried out at an irradiation amount of approximately 50 to 10,000 mJ/cm$^2$. Also, the conditions of heating can be appropriately selected if required, but they are preferably selected from the range of 20 to 180 minutes at 150 to 220° C., and more preferably from the range of 30 to 150 minutes at 160 to 200° C.

(Conductor Layer Formation Step)

After forming the insulation layer (cured product), a conductor layer is formed on the surface of the insulation layer by dry plating. For the dry plating, a publicly known method such as a vapor deposition method, a sputtering method, and an ion plating method can be used. In the vapor deposition method (vacuum deposition method), for example, a metallic film can be formed on the insulation layer by placing the multilayer printed wiring board in a vacuum container and heating and evaporating the metal. In the sputtering method as well, for example, the multilayer printed wiring board is placed in a vacuum container, an inert gas such as argon is introduced, a direct current voltage is applied, the ionized inert gas is brought into collision with the target metal, and the knocked-out metal can be used to form a metallic film on the insulation layer.

Next, a conductor layer is formed by nonelectrolytic plating or electroplating. As a method of subsequent patterning, for example, a subtractive method, a semi-additive method, or the like can be used.

[Semiconductor Device]

A semiconductor device of the present embodiment contains the resin composition of the present embodiment. In particular, it can be produced by the following method. A semiconductor device can be produced by mounting a semiconductor chip at the conduction points on the multilayer printed wiring board. Here, the conduction points refer to the points in the multilayer printed wiring board where electrical signals are conveyed, and the locations thereof may be on the surface or at embedded points. In addition, the semiconductor chips are not particularly limited as long as they are electrical circuit elements made of semiconductors.

The method for mounting the semiconductor chip upon producing the semiconductor device is not particularly limited as long as the semiconductor chip effectively functions. Specific examples thereof include a wire bonding mounting method, a flip chip mounting method, a mounting method with a bumpless build-up layer (BBUL), a mounting method with an anisotropic conductive film (ACF), and a mounting method with a non-conductive film (NCF).

Alternatively, the semiconductor device can be produced by forming an insulation layer containing the resin composition on a semiconductor chip or a substrate on which the semiconductor chip is mounted. The shape of the substrate on which semiconductor chip is mounted may be wafer-like or panel-like. After the formation, the semiconductor device can be produced using the same method as the multilayer printed wiring board.

EXAMPLES

The present embodiment will be more specifically described below using an Example and a Comparative Example. The present embodiment is not limited in any way by the following Example.

[Evaluation of Raw Material]
[Transmittance and Absorbance]

As the bismaleimide compound (A), MIZ-001 (product name, mass average molecular weight (Mw): 3000) manufactured by Nippon Kayaku Co., Ltd. was used to prepare a chloroform solution containing this MIZ-001 (product name) at 1% by mass, and measurement of the transmittance at each of a wavelength of 365 nm and a wavelength of 405 nm was carried out using an UV-vis measuring apparatus (Hitachi Spectrophotometer U-4100 (product name) manufactured by Hitachi High-Technologies Corporation).

Similarly, measurement of the transmittance at each of a wavelength of 365 nm and a wavelength of 405 nm was carried out using BMI-70 (product name, mass average molecular weight (Mw): 443) manufactured by K•I Chemical Industry Co., LTD., BMI-80 (product name, mass average molecular weight (Mw): 570, 2,2-bis(4-(4-maleimide-phenoxy)-phenyl)propane) manufactured by K•I Chemical Industry Co., LTD. and MIR-3000 (product name, mass average molecular weight (Mw): 1300) manufactured by Nippon Kayaku Co., Ltd. as the maleimide compound.

As the compound (B) containing one or more carboxy groups, cis-4-cyclohexene-1,2-dicarboxylic anhydride (manufactured by Tokyo Chemical Industry Co., Ltd., molecular weight: 152) was used to prepare a N-methylpyrrolidone solution containing this cis-4-cyclohexene-1,2-dicarboxylic anhydride at 1% by mass, and measurement of the transmittance at each of a wavelength of 365 nm and a wavelength of 405 nm was carried out using an UV-vis measuring apparatus (Hitachi Spectrophotometer U-4100 (product name) manufactured by Hitachi High-Technologies Corporation).

Similarly, measurement of the transmittance at each of a wavelength of 365 nm and a wavelength of 405 nm was carried out using 4-aminobenzoic acid (manufactured by Tokyo Chemical Industry Co., Ltd., molecular weight: 137), salicylic acid (manufactured by Tokyo Chemical Industry Co., Ltd., molecular weight: 138), piperidinecarboxylic acid (manufactured by Tokyo Chemical Industry Co., Ltd., molecular weight: 129), phthalic acid (manufactured by Tokyo Chemical Industry Co., Ltd., molecular weight: 166), trimellitic acid (manufactured by Tokyo Chemical Industry Co., Ltd., molecular weight: 210), pyromellitic acid (manufactured by Tokyo Chemical Industry Co., Ltd., molecular weight: 254), cis-4-cyclohexene-1,2-dicarboxylic acid (manufactured by Tokyo Chemical Industry Co., Ltd., molecular weight: 170) and 1,2-phenylenediacetic acid (manufactured by Tokyo Chemical Industry Co., Ltd., molecular weight: 194).

As the photo initiator (C), bis(2,4,6-trimethylbenzoyl)-phenylphosphine oxide (Omnirad (registered trademark) 819 (product name) manufactured by IGM Resins B.V.) was used to prepare a chloroform solution containing this Omnirad (registered trademark) 819 at 0.01% by mass, and measurement of the absorbance at each of a wavelength of 365 nm and a wavelength of 405 nm was carried out using an UV-vis measuring apparatus (Hitachi Spectrophotometer U-4100 (product name) manufactured by Hitachi High-Technologies Corporation).

In the same manner, 2-benzyl-2-dimethylamino-1-(4-morpholinophenyl)-butanone-1 (Omnirad (registered trademark) 369 (product name) manufactured by IGM Resins B.V.) and 2-methyl-1-[4-(methylthio)phenyl]-2-morpholinopropan-1-one (Omnirad (registered trademark) 907 (product name) manufactured by IGM Resins B.V.) were used as the photo initiators, and measurement of the absorbance at each of a wavelength of 365 nm and a wavelength of 405 nm was carried out.

The results are shown in Table 1.

molding at a pressure of 7 kgf/cm$^2$ and a temperature of 70° C. for 60 seconds, a resin for evaluation with supports on both surfaces was obtained.

(Fabrication of Inner Layer Circuit Substrate)

After forming an inner layer circuit in a BT (bismaleimide triazine) resin laminate with a glass cloth base material, both surfaces of which are copper clad (copper foil thickness of 18 μm, thickness of 0.2 mm, CCL (registered trademark)-HL832NS (product name) manufactured by Mitsubishi Gas Chemical Company, Inc.), both surfaces were subjected to roughening treatment for copper surfaces with CZ8100 (product name) manufactured by MEC Co., Ltd., thereby obtaining an inner layer circuit substrate.

(Fabrication of Laminate for Evaluation)

The resin surface of the obtained resin sheet was disposed on the copper surface (one surface) of the inner layer circuit substrate described above, and a vacuum laminator (manu-

TABLE 1

| | | Transmittance at 365 nm [%] | Transmittance at 405 nm [%] | Absorbance at 365 nm [—] | Absorbance at 405 nm [—] |
|---|---|---|---|---|---|
| Bismaleimide compound (A) | MIZ-001 | 19 | 88 | — | — |
| Maleimide compound | BMI-70 | 0 | 44 | — | — |
| | BMI-80 | 0 | 0 | — | — |
| | MIR-3000 | 0 | 2.2 | — | — |
| Compound (B) containing one or more carboxy groups | cis-4-cyclohexene-1,2-dicarboxylic anhydride | 97 | 98 | — | — |
| | 4-Aminobenzoic acid | 94 | 98 | — | — |
| | Salicylic acid | 95 | 98 | — | — |
| | Piperidinecarboxylic acid | 96 | 98 | — | — |
| | Phthalic acid | 97 | 100 | — | — |
| | Trimellitic acid | 98 | 100 | — | — |
| | Pyromellitic acid | 97 | 99 | — | — |
| | cis-4-cyclohexene-1,2-dicarboxylic acid | 98 | 100 | — | — |
| | 1,2-phenylenediacetic acid | 70 | 81 | — | — |
| Photo initiator (C) | Omnirad819 | — | — | 0.32 | 0.18 |
| | Omnirad369 | — | — | 0.48 | 0.04 |
| | Omnirad907 | — | — | 0.10 | 0.01 |

Example 1

[Fabrication of Resin Composition and Resin Sheet]

86 parts by mass of MIZ-001 (product name) as the bismaleimide compound (A), 9 parts by mass of cis-4-cyclohexene-1,2-dicarboxylic anhydride as the compound (B) containing one or more carboxy groups and 5 parts by mass of bis(2,4,6-trimethylbenzoyl)-phenylphosphine oxide (Omnirad (registered trademark) 819 (product name)) as the photo initiator (C) were mixed, diluted with 150 parts by mass of methyl ethyl ketone (manufactured by Idemitsu Kosan Co., Ltd.), and then stirred with an ultrasonic homogenizer, thereby obtaining a varnish (solution of the resin composition).

This varnish is applied onto a PET film with a thickness of 38 μm (Unipeel (registered trademark) TR1-38 (product name) manufactured by UNITIKA LTD.) using an auto film applicator (PI-1210 (product name) manufactured by TESTER SANGYO CO., LTD.) and heated and dried at 90° C. for 5 minutes, thereby obtaining a resin sheet having the PET film as a support and a resin layer with a thickness of 30 μm.

(Fabrication of Resin for Evaluation)

The resin surfaces of the obtained resin sheets were pasted together, and a vacuum laminator (manufactured by Nikko-Materials Co., Ltd.) was used to perform vacuum drawing (5.0 hPa or less) for 30 seconds, followed by lamination molding at a pressure of 10 kgf/cm$^2$ and a temperature of 70° C. for 30 seconds. Furthermore, by performing lamination factured by Nikko-Materials Co., Ltd.) was used to perform vacuum drawing (5.0 hPa or less) for 30 seconds, followed by lamination molding at a pressure of 10 kgf/cm$^2$ and a temperature of 70° C. for 30 seconds. Furthermore, by performing lamination molding at a pressure of 10 kgf/cm$^2$ and a temperature of 70° C. for 60 seconds, a laminate for evaluation in which the inner layer circuit substrate, the resin layer and the support were laminated was obtained.

Example 2

A resin sheet was obtained in the same manner as in Example 1 except that as the compound (B) containing one or more carboxy groups, 9 parts by mass of 4-aminobenzoic acid was used instead of 9 parts by mass of cis-4-cyclohexene-1,2-dicarboxylic anhydride. Using this resin sheet, a resin for evaluation and a laminate for evaluation were obtained in the same manner as in Example 1.

Example 3

A resin sheet was obtained in the same manner as in Example 1 except that as the compound (B) containing one or more carboxy groups, 9 parts by mass of salicylic acid was used instead of 9 parts by mass of cis-4-cyclohexene-1,2-dicarboxylic anhydride. Using this resin sheet, a resin for evaluation and a laminate for evaluation were obtained in the same manner as in Example 1.

Example 4

A resin sheet was obtained in the same manner as in Example 1 except that as the compound (B) containing one or more carboxy groups, 9 parts by mass of piperidinecarboxylic acid was used instead of 9 parts by mass of cis-4-cyclohexene-1,2-dicarboxylic anhydride. Using this resin sheet, a resin for evaluation and a laminate for evaluation were obtained in the same manner as in Example 1.

Example 5

A resin sheet was obtained in the same manner as in Example 1 except that as the compound (B) containing one or more carboxy groups, 9 parts by mass of phthalic acid was used instead of 9 parts by mass of cis-4-cyclohexene-1,2-dicarboxylic anhydride. Using this resin sheet, a resin for evaluation and a laminate for evaluation were obtained in the same manner as in Example 1.

Example 6

A resin sheet was obtained in the same manner as in Example 1 except that as the compound (B) containing one or more carboxy groups, 9 parts by mass of trimellitic acid was used instead of 9 parts by mass of cis-4-cyclohexene-1,2-dicarboxylic anhydride. Using this resin sheet, a resin for evaluation and a laminate for evaluation were obtained in the same manner as in Example 1.

Example 7

A resin sheet was obtained in the same manner as in Example 1 except that as the compound (B) containing one or more carboxy groups, 9 parts by mass of pyromellitic acid was used instead of 9 parts by mass of cis-4-cyclohexene-1,2-dicarboxylic anhydride. Using this resin sheet, a resin for evaluation and a laminate for evaluation were obtained in the same manner as in Example 1.

Example 8

A resin sheet was obtained in the same manner as in Example 1 except that as the compound (B) containing one or more carboxy groups, 9 parts by mass of cis-4-cyclohexene-1,2-dicarboxylic acid was used instead of 9 parts by mass of cis-4-cyclohexene-1,2-dicarboxylic anhydride. Using this resin sheet, a resin for evaluation and a laminate for evaluation were obtained in the same manner as in Example 1.

Example 9

A resin sheet was obtained in the same manner as in Example 1 except that as the compound (B) containing one or more carboxy groups, 9 parts by mass of 1,2-phenylenediacetic acid was used instead of 9 parts by mass of cis-4-cyclohexene-1,2-dicarboxylic anhydride. Using this resin sheet, a resin for evaluation and a laminate for evaluation were obtained in the same manner as in Example 1.

Example 10

A resin sheet was obtained in the same manner as in Example 1 except that as the photo initiator (C), 5 parts by mass of 2-benzyl-2-dimethylamino-1-(4-morpholinophenyl)-butanone-1 (Omnirad (registered trademark) 369 (product name)) was used instead of 5 parts by mass of bis(2,4,6-trimethylbenzoyl)-phenylphosphine oxide (Omnirad (registered trademark) 819 (product name)). Using this resin sheet, a resin for evaluation and a laminate for evaluation were obtained in the same manner as in Example 1.

Example 11

A resin sheet was obtained in the same manner as in Example 1 except that as the photo initiator (C), 5 parts by mass of 2-methyl-1-[4-(methylthio)phenyl]-2-morpholinopropan-1-one (Omnirad (registered trademark) 907 (product name)) was used instead of 5 parts by mass of bis(2,4,6-trimethylbenzoyl)-phenylphosphine oxide (Omnirad (registered trademark) 819 (product name)). Using this resin sheet, a resin for evaluation and a laminate for evaluation were obtained in the same manner as in Example 1.

Comparative Example 1

86 parts by mass of MIZ-001 (product name) as the bismaleimide compound (A) and 5 parts by mass of bis(2,4,6-trimethylbenzoyl)-phenylphosphine oxide (Omnirad (registered trademark) 819 (product name)) as the photo initiator (C) were mixed, diluted with 150 parts by mass of methyl ethyl ketone (manufactured by Idemitsu Kosan Co., Ltd.), and then stirred with an ultrasonic homogenizer, thereby obtaining a varnish (solution of the resin composition).

This varnish is applied onto a PET film with a thickness of 38 μm (Unipeel (registered trademark) TR1-38 (product name) manufactured by UNITIKA LTD.) using an auto film applicator (PI-1210 (product name) manufactured by TESTER SANGYO CO., LTD.) and heated and dried at 90° C. for 5 minutes, thereby obtaining a resin sheet having the PET film as a support and a resin layer with a thickness of 30 μm.

Using this resin sheet, a resin for evaluation and a laminate for evaluation were obtained in the same manner as in Example 1.

Comparative Example 2

86 parts by mass of MIZ-001 (product name) as the bismaleimide compound (A) and 9 parts by mass of cis-4-cyclohexene-1,2-dicarboxylic anhydride as the compound (B) containing one or more carboxy groups were mixed, diluted with 150 parts by mass of methyl ethyl ketone (manufactured by Idemitsu Kosan Co., Ltd.), and then stirred with an ultrasonic homogenizer, thereby obtaining a varnish (solution of the resin composition).

This varnish is applied onto a PET film with a thickness of 38 μm (Unipeel (registered trademark) TR1-38 (product name) manufactured by UNITIKA LTD.) using an auto film applicator (PI-1210 (product name) manufactured by TESTER SANGYO CO., LTD.) and heated and dried at 90° C. for 5 minutes, thereby obtaining a resin sheet having the PET film as a support and a resin layer with a thickness of 30 μm.

Using this resin sheet, a resin for evaluation and a laminate for evaluation were obtained in the same manner as in Example 1.

Comparative Example 3

86 parts by mass of BMI-70 (product name) as the maleimide compound, 9 parts by mass of cis-4-cyclohexene- 1,2-dicarboxylic anhydride as the compound (B) containing one or more carboxy groups and 5 parts by mass of bis(2,4,6-trimethylbenzoyl)-phenylphosphine oxide (Omnirad (registered trademark) 819) as the photo initiator (C) were mixed, diluted with 150 parts by mass of methyl ethyl ketone (manufactured by Idemitsu Kosan Co., Ltd.), and then stirred with an ultrasonic homogenizer, thereby obtaining a varnish (solution of the resin composition).

This varnish is applied onto a PET film with a thickness of 38 μm (Unipeel (registered trademark) TR1-38 (product name) manufactured by UNITIKA LTD.) using an auto film applicator (PI-1210 (product name) manufactured by TESTER SANGYO CO., LTD.) and heated and dried at 90° C. for 5 minutes, thereby obtaining a resin sheet having the PET film as a support and a resin layer with a thickness of 30 μm.

Using this resin sheet, a resin for evaluation and a laminate for evaluation were obtained in the same manner as in Example 1.

Comparative Example 4

A resin sheet was obtained in the same manner as in Comparative Example 3 except that as the maleimide compound, 86 parts by mass of BMI-80 (product name) was used instead of 86 parts by mass of BMI-70 (product name). Using this resin sheet, a resin for evaluation and a laminate for evaluation were obtained in the same manner as in Example 1.

Comparative Example 5

A resin sheet was obtained in the same manner as in Comparative Example 3 except that as the maleimide compound, 86 parts by mass of MIR-3000 (product name) was used instead of 86 parts by mass of BMI-70 (product name). Using this resin sheet, a resin for evaluation and a laminate for evaluation were obtained in the same manner as in Example 1.

[Measurement and Evaluation of Physical Properties]

The resins for evaluation and the laminates for evaluation, which had been obtained in Examples and Comparative Examples, were measured and evaluated in accordance with the following methods. The results are shown in Tables 2 and 3 and FIG. 1.

<Photocurability>

By using a photo DSC (DSC-2500 (brand name) manufactured by TA Instruments Japan Inc.) equipped with a light source (Omnicure (registered trademark) 52000 (product name) manufactured by U—VIX Corporation) that is capable of being irradiated with an active energy ray including a wavelength of 200 to 600 nm, the obtained resin for evaluation was irradiated with an active energy ray including a wavelength of 200 to 600 nm at an illuminance of 30 mW and for an exposure time of 3.5 minutes, thereby obtaining a graph of time (sec) on the horizontal axis and heat flow (mW) on the vertical axis.

A graph of time (sec) on the horizontal axis and heat flow (mW) on the vertical axis was obtained under the same conditions as described above except that a filter for a ray with a wavelength of 365 nm (i-line) or a ray with a wavelength of 405 nm (h-line) was used, and an active energy ray including a wavelength of 365 nm (i-line) or an active energy ray including a wavelength of 405 nm (h-line) was used.

In each graph, the enthalpy (J/g) was defined as the peak area when a line was drawn horizontally from the endpoint of the graph. The curability was evaluated in accordance with the following criteria.

AA: enthalpy was 50 (J/g) or more.
BB: enthalpy was 1 (J/g) or more and less than 50 (J/g).
CC: enthalpy was less than 1 (J/g).

Note that an enthalpy of 1 (J/g) or more means that the curing of the resin is advanced by exposure at a predetermined wavelength, and an enthalpy of 50 (J/g) or more means that the curing of the resin is sufficiently advanced by exposure at a predetermined wavelength.

<Alkaline Developability>

Using a light source capable of applying an active energy ray including a wavelength of 405 nm (h-line) (MA-20 (product name) manufactured by MIKASA CO., LTD), the obtained laminate for evaluation was irradiated from above the support at an irradiation amount of 200 mJ/cm² to expose a half of the resin sheet while the other half is unexposed. Thereafter, the support (PET film) was peeled, and the laminate was shaken in aqueous 2.38% TMAH (tetramethylammonium hydroxide) solution (developing solution, manufactured by Tokuyama Corporation) for 60 seconds. For the laminate obtained after the shaking for 60 seconds, alkaline developability was visually evaluated in accordance with the following criteria.

"AA": the exposed portion is not dissolved, and the unexposed portion is dissolved by shaking for 60 seconds.

"CC": either the exposed portion or the unexposed portion is not dissolved.

FIG. 1 shows photographs after alkaline development performed with the use of the laminates for evaluation which were obtained in Example 1 and Comparative Example 1.

| | | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|---|
| Bismaleimide compound (A) | MIZ-001 | 86 | 86 | 86 | 86 | 86 | 86 | 86 | 86 | 86 | 86 | 86 |
| Maleimide compound | BMI-70 | | | | | | | | | | | |
| | BMI-80 | | | | | | | | | | | |
| | MIR-3000 | | | | | | | | | | | |
| Compound (B) containing one or more carboxy groups | cis-4-cyclohexene-1,2-dicarboxylic anhydride | 9 | | | | | | | | | 9 | 9 |
| | 4-Aminobenzoic acid | | 9 | | | | | | | | | |
| | Salicylic acid | | | 9 | | | | | | | | |
| | Piperidinecarboxylic acid | | | | 9 | | | | | | | |
| | Phthalic acid | | | | | 9 | | | | | | |
| | Trimellitic acid | | | | | | | 9 | | | | |
| | Pyromellitic acid | | | | | | | | 9 | | | |

-continued

|  |  | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|---|
|  | cis-4-cyclohexene-1,2-dicarboxylic acid |  |  |  |  |  |  |  | 9 |  |  |  |
|  | 1,2-phenylenediacetic acid |  |  |  |  |  |  |  |  | 9 |  |  |
| Photo initiator (C) | Omnirad819 | 5 | 5 | 5 | 5 | 5 | 5 | 5 | 5 | 5 |  |  |
|  | Omnirad369 |  |  |  |  |  |  |  |  |  | 5 |  |
|  | Omnirad907 |  |  |  |  |  |  |  |  |  |  | 5 |
| Evaluation results | Photocurability (365 nm) | AA | AA | AA | AA | AA | AA | AA | AA | AA | AA | AA |
|  | Photocurability (405 nm) | AA | AA | AA | AA | AA | AA | AA | AA | AA | BB (44.3 J/g) | BB (3.2 J/g) |
|  | Photocurability (200-600 nm) | AA | AA | AA | AA | AA | AA | AA | AA | AA | AA | AA |
|  | Alkaline developability | AA | AA | AA | AA | AA | AA | AA | AA | AA | AA | AA |

|  |  | Comparative Example 1 | Comparative Example 2 | Comparative Example 3 | Comparative Example 4 | Comparative Example 5 |
|---|---|---|---|---|---|---|
| Bismaleimide compound (A) | MIZ-001 | 86 | 86 |  |  |  |
| Maleimide compound | BMI-70 |  |  | 86 |  |  |
|  | BMI-80 |  |  |  | 86 |  |
|  | MIR-3000 |  |  |  |  | 86 |
| Compound (B) containing one or more carboxy groups | cis-4-cyclohexene-1,2-dicarboxylic anhydride |  | 9 | 9 | 9 | 9 |
|  | 4-Aminobenzoic acid |  |  |  |  |  |
|  | Salicylic acid |  |  |  |  |  |
|  | Piperidinecarboxylic acid |  |  |  |  |  |
|  | Phthalic acid |  |  |  |  |  |
|  | Trimellitic acid |  |  |  |  |  |
|  | Pyromellitic acid |  |  |  |  |  |
|  | cis-4-cyclohexene-1,2-dicarboxylic acid |  |  |  |  |  |
|  | 1,2-phenylenediacetic acid |  |  |  |  |  |
| Photo initiator (C) | Omnirad819 | 5 |  | 5 | 5 | 5 |
|  | Omnirad369 |  |  |  |  |  |
|  | Omnirad907 |  |  |  |  |  |
| Evaluation results | Photocurability (365 nm) | AA | CC | CC | CC | CC |
|  | Photocurability (405 nm) | AA | CC | AA | CC | CC |
|  | Photocurability (200-600 nm) | AA | CC | AA | CC | CC |
|  | Alkaline developability | CC | CC | CC | CC | CC |

Tables 2 and 3 reveal that according to the present embodiment, exposure with any of an active energy ray including a wavelength of 365 nm (i-line), an active energy ray including a wavelength of 405 nm (h-line) and an active energy ray including a wavelength of 200 to 600 nm ensures that the resin composition is properly light-sensitive and can be photocured. According to the present embodiment, a cured product having excellent alkaline developability can be obtained as shown in Tables 2 and 3 and FIG. 1.

In Comparative Example 3, the resin composition was sensitive to an active energy ray including a wavelength of 405 nm (h-line) and an active energy ray including a wavelength of 200 to 600 nm, but either the exposed portion or the unexposed portion was not dissolved, and excellent alkaline developability was not obtained. The reason for this was thought to be that since the maleimide compound has a relatively low molecular weight, the maleimide compound was not able to dissolve in the alkaline developing solution as the compound (B) was dissolved in the alkaline developing solution, and therefore mainly the maleimide compound remained undissolved, and was not dissolved in the alkaline developing solution.

The present application is based on Japanese Patent Application No. 2019-122156 filed on Jun. 28, 2019, the contents of which are incorporated herein by reference.

INDUSTRIAL APPLICABILITY

The resin composition of the present embodiment is excellent in photocurability and alkaline developability, and therefore industrially useful, and can be used for applications including, for example, a photosensitive film, a photosensitive film with a support, a prepreg, a resin sheet, a circuit substrate (applications for a laminate, applications for a multilayer printed wiring board, and the like), a solder resist, an underfill material, a die bonding material, a semiconductor sealing material, a hole filling resin, and a component embedding resin.

The invention claimed is:
1. A resin composition comprising:
   a bismaleimide compound (A) containing a constituent unit represented by the following formula (1), and maleimide groups at both ends of the molecular chain;
   a compound (B) containing one or more carboxy groups; and
   a photo initiator (C),
   wherein the content of the bismaleimide compound (A) is 40 to 99 parts by mass based on 100 parts by mass of the total of the bismaleimide compound (A), the compound (B) containing one or more carboxy groups, and the photo initiator (C), wherein the content of the compound (B) containing one or more carboxy groups is 0.01 to 35 parts by mass based on 100 parts by mass of the total of the bismaleimide compound (A), the compound (B) containing one or more carboxy groups, and the photo initiator (C), and wherein the content of the photo initiator (C) is 0.99 to 25 parts by mass based on 100 parts by mass of the total of the bismaleimide compound (A), the compound (B) containing one or more carboxy groups, and the photo initiator (C):

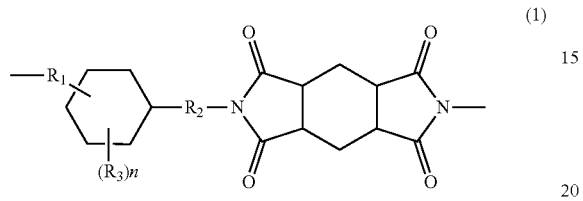

(1)

wherein $R_1$ represents a linear or branched alkylene group having 1 to 16 carbon atoms, or a linear or branched alkenylene group having 2 to 16 carbon atoms; $R_2$ represents a linear or branched alkylene group having 1 to 16 carbon atoms, or a linear or branched alkenylene group having 2 to 16 carbon atoms; each $R_3$ independently represents a hydrogen atom, a linear or branched alkyl group having 1 to 16 carbon atoms, or a linear or branched alkenyl group having 2 to 16 carbon atoms; and each n independently represents an integer of 1 to 10.

2. The resin composition according to claim 1, wherein the compound (B) containing one or more carboxy groups is at least one compound selected from the group consisting of a compound represented by the following formula (2), a compound represented by the following formula (3), a compound represented by the following formula (4) and a compound represented by the following formula (5):

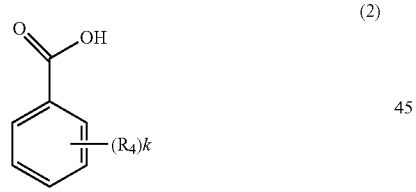

(2)

wherein each $R_4$ independently represents a hydrogen atom, a hydroxyl group, a carboxy group, an amino group or an aminomethyl group; each k independently represents an integer of 1 to 5; and when two or more carboxy groups are present, the carboxy groups are optionally linked together to form an acid anhydride,

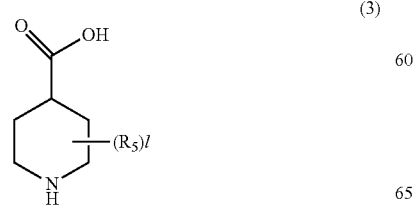

(3)

wherein each $R_5$ independently represents a hydrogen atom, a hydroxyl group, a carboxy group, a carboxymethyl group, an amino group or an aminomethyl group; each l independently represents an integer of 1 to 9; when two or more carboxy groups are present, the carboxy groups are optionally linked together to form an acid anhydride; and when a carboxymethyl group is present, the carboxymethyl group and the carboxy group are optionally linked together to form an acid anhydride,

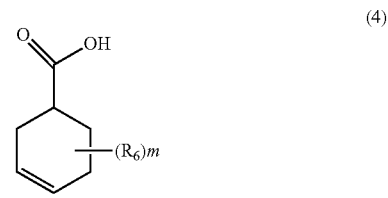

(4)

wherein each $R_6$ independently represents a hydrogen atom, a hydroxyl group, a carboxy group, a carboxymethyl group, an amino group or an aminomethyl group; each m independently represents an integer of 1 to 9; when two or more carboxy groups are present, the carboxy groups are optionally linked together to form an acid anhydride; and when a carboxymethyl group is present, the carboxymethyl group and the carboxy group are optionally linked together to form an acid anhydride, and

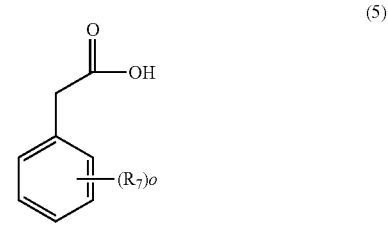

(5)

wherein each $R_7$ independently represents a hydrogen atom, a hydroxyl group, a carboxy group, a carboxymethyl group, an amino group or an aminomethyl group; and each o independently represents an integer of 1 to 5; when one or more carboxy groups are present, the carboxymethyl group and the carboxy group are optionally linked together to form an acid anhydride; when two or more carboxy groups are present, the carboxy groups are optionally linked together to form an acid anhydride; and when two or more carboxymethyl groups are present, the carboxymethyl groups are optionally linked together to form an acid anhydride.

3. The resin composition according to claim 1, wherein the photo initiator (C) comprises a compound represented by the following formula (6):

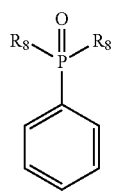 (6)

wherein each $R_8$ independently represents a substituent represented by the following formula (7) or a phenyl group; and

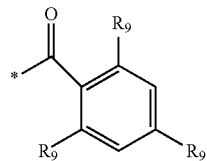 (7)

wherein -* represents a bonding hand, and each $R_9$ independently represents a hydrogen atom or a methyl group.

4. A resin sheet comprising:

a support; and a resin layer disposed on one surface or both surfaces of the support, wherein the resin layer comprises the resin composition according to claim 1.

5. The resin sheet according to claim 4, wherein the resin layer has a thickness of 1 to 50 μm.

6. A multilayer printed wiring board comprising:

an insulation layer; and a conductor layer formed on one surface or both surfaces of the insulation layer, wherein the insulation layer comprises the resin composition according to claim 1.

7. A semiconductor device comprising the resin composition according to claim 1.

* * * * *